US008306499B2

(12) United States Patent
Yamakawa et al.

(10) Patent No.: US 8,306,499 B2
(45) Date of Patent: Nov. 6, 2012

(54) HIGH-FREQUENCY FILTER

(75) Inventors: Takehiko Yamakawa, Osaka (JP); Toshiyuki Okajima, Shiga (JP); Hiroshi Nakatsuka, Osaka (JP); Keiji Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 384 days.

(21) Appl. No.: 12/745,615

(22) PCT Filed: Nov. 25, 2008

(86) PCT No.: PCT/JP2008/003460
§ 371 (c)(1),
(2), (4) Date: Jun. 1, 2010

(87) PCT Pub. No.: WO2009/072251
PCT Pub. Date: Jun. 11, 2009

(65) Prior Publication Data
US 2010/0291946 A1  Nov. 18, 2010

(30) Foreign Application Priority Data

Dec. 3, 2007 (JP) .................. 2007-312312

(51) Int. Cl.
*H04B 1/10* (2006.01)
(52) U.S. Cl. .............................. 455/307; 455/339
(58) Field of Classification Search ............ 455/307,
455/296, 226.2, 226.3, 67.11, 67.13, 254,
455/213, 286, 299, 306, 339; 333/185, 177,
333/184, 202–205, 167
See application file for complete search history.

(56) References Cited

U.S. PATENT DOCUMENTS

| 5,291,161 | A  | * | 3/1994 | Saka ........................... 333/204 |
|---|---|---|---|---|
| 5,629,655 | A  | * | 5/1997 | Dent ........................... 333/184 |
| 6,271,719 | B1 | * | 8/2001 | Sevastopoulos .............. 455/307 |
| 7,010,270 | B1 | * | 3/2006 | Thomas et al. ............... 455/339 |
| 7,535,413 | B2 | * | 5/2009 | Leinonen et al. .......... 455/67.13 |
| 7,982,557 | B2 | * | 7/2011 | Sakisaka et al. ............. 333/185 |
| 2001/0008388 | A1 | * | 7/2001 | Jun et al. ...................... 333/202 |
| 2003/0068998 | A1 |  | 4/2003 | Yamakawa et al. |
| 2003/0076195 | A1 |  | 4/2003 | Ishizaki et al. |
| 2005/0212612 | A1 |  | 9/2005 | Kawakubo et al. |

(Continued)

FOREIGN PATENT DOCUMENTS

JP    2001-352221    12/2001

(Continued)

OTHER PUBLICATIONS

International Search Report issued Dec. 22, 2008 in corresponding International Application No. PCT/JP2008/003460.

*Primary Examiner* — Lana N Le
(74) *Attorney, Agent, or Firm* — Wenderoth, Lind & Ponack, L.L.P.

(57) ABSTRACT

A digital television broadcast receiving section (100) of a mobile telephone terminal includes an antenna (101), a notch filter (102), a low-pass filter (LPF) (103), a low noise amplifier (LNA) (104), a receiving IC (105), a control section (107), and an input section (108). A passband for digital television broadcast is divided into several parts. The control section (107) switches a characteristic of each of the notch filter (102) and the LPF (103) so as to combine filters appropriate for a low-band channel or a high-band channel. Thus, frequencies in a mobile telephone transmission frequency band of the mobile telephone terminal, and frequencies in a band of other systems, the frequencies in these band being interfering waves, are largely attenuated, and at the same time, frequencies in the passband which is a frequency band for digital television broadcast are allowed to pass with low loss.

11 Claims, 15 Drawing Sheets

U.S. PATENT DOCUMENTS

2009/0189715 A1 * 7/2009 Sakisaka et al. .............. 333/185

FOREIGN PATENT DOCUMENTS

| | | |
|---|---|---|
| JP | 2003-158467 | 5/2003 |
| JP | 2003-179463 | 6/2003 |
| JP | 2003-224483 | 8/2003 |
| JP | 2005-217852 | 8/2005 |
| JP | 2007-202136 | 8/2007 |
| WO | 2007/111311 | 10/2007 |

* cited by examiner

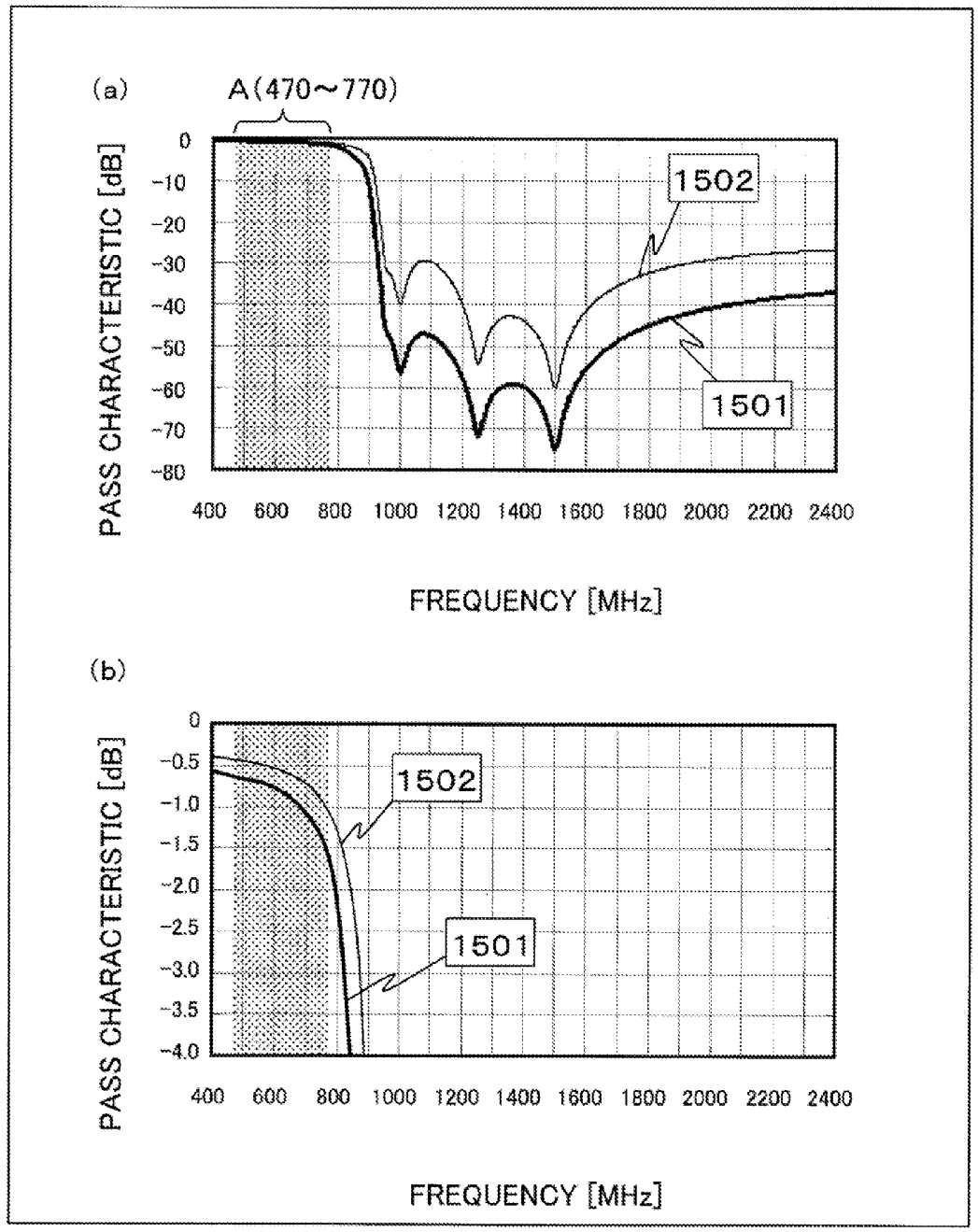

US 8,306,499 B2

HIGH-FREQUENCY FILTER

TECHNICAL FIELD

The present invention relates to a high-frequency filter and a communication apparatus which are used for a radio circuit in a mobile telephone for mobile communication of a digital television or the like, and more particularly, to a high-frequency filter and a communication apparatus which largely attenuates frequencies in a frequency band of an interfering wave, and allows frequencies in a passband which is a frequency band for digital television broadcast to pass with low loss.

BACKGROUND ART

In recent years, among electronic apparatuses such as a mobile telephone, various terminals which allow digital television broadcast to be watched are on the market, the components of a radio circuit included in the terminals are required to be miniaturized, and loss caused in the components is required to be reduced. Among the components, a receiving circuit which receives digital television broadcast needs a filter which allows, among received signals, frequencies in a wide band (470 to 770 MHz) for digital television broadcast to pass, and which reduces: a high-frequency signal in a frequency band (830 to 840 MHz) for a mobile telephone, transmitted by a mobile telephone terminal; and an interfering wave from other systems. A high-frequency filter using a piezoelectric resonator such as an SAW (Surface Acoustic Wave Device) or an FBAR (Film Bulk Acoustic Resonator) are known as a filter satisfying requirements that, as described above, the passband is a wide band having a fractional bandwidth (bandwidth/frequency) of about 50%, which is an index indicating a frequency resource, and that an attenuation band in which the attenuation amount is large is placed in the vicinity of the passband. A configuration of a high-frequency filter formed by a combination of a notch filter and a low-pass filter will be described below.

FIG. 11 is a block diagram showing a digital television broadcast receiving section 1000 of a mobile telephone terminal of conventional art, which allows digital television broadcast to be watched. As shown in FIG. 11, the digital television broadcast receiving section 1000 of the mobile telephone terminal includes an antenna 1001, a notch filter 1002, a low-pass filter (LPF) 1003, a low noise amplifier (LNA) 1004, and a receiving IC 1005.

A high-frequency signal received via the antenna 1001 is filtered by the high-frequency filter 1006 formed by the notch filter 1002 and the low-pass filter 1003. First, among received high-frequency signals, the notch filter 1002 largely attenuates frequencies in a mobile telephone transmission frequency band of the mobile telephone terminal, and passes, with low loss, frequencies in a frequency band for digital television broadcast. Next, among high-frequency signals filtered by the notch filter 1002, the low-pass filter 1003 largely attenuates frequencies in an interfering wave frequency band of other systems, which band is largely distant from the frequency band for digital television broadcast, and passes, with low loss, the frequencies in the frequency band for digital television broadcast. The high-frequency signals filtered by the notch filter 1002 and the low-pass filter 1003 are amplified, with low distortion, by the low noise amplifier 1004, and then the amplified high-frequency signals are converted to baseband signals by the receiving IC 1005.

FIG. 12 is an equivalent circuit diagram of the notch filter 1002 of conventional art. As shown in FIG. 12, the notch filter 1002 includes an input matching circuit section 1102a, a notch filter section 1103, and an output matching circuit section 1102b.

The input matching circuit section 1102a includes a series inductor 1106a one end of which is connected to an input terminal 1101a, and a parallel inductor 1107a one end of which is connected to the other end of the series inductor 1106a. Note that the other end of the parallel inductor 1107a is grounded.

The notch filter section 1103 is a π-type three-stage circuit including a series piezoelectric resonator 1104, a first parallel piezoelectric resonator 1105a, and a second parallel piezoelectric resonator 1105b, one end of the first parallel piezoelectric resonator 1105a and one end of the second parallel piezoelectric resonator 1105b being connected to the respective ends of the series piezoelectric resonator 1104. Note that the other end of the first parallel piezoelectric resonator 1105a and the other end of the second parallel piezoelectric resonator 1105b are grounded. In addition, a connection point between the series piezoelectric resonator 1104 and the first parallel piezoelectric resonator 1105a is connected to a connection point between the series inductor 1106a and the parallel inductor 1107a of the input matching circuit section 1102a.

The output matching circuit section 1102b includes a series inductor 1106b one end of which is connected to an output terminal 1101b, and a parallel inductor 1107b one end of which is connected to the other end of the series inductor 1106b. Note that the other end of the parallel inductor 1107b is grounded. In addition, a connection point between the series inductor 1106b and the parallel inductor 1107b is connected to a connection point between the series piezoelectric resonator 1104 and the second parallel piezoelectric resonator 1105b of the notch filter section 1103.

Each of the characteristics of the series piezoelectric resonator 1104, the first parallel piezoelectric resonator 1105a, and the second parallel piezoelectric resonator 1105b alone has a resonance point at which the impedance is 0, and an antiresonance point at which the impedance reaches infinity. A frequency at the resonance point is a resonance frequency, and a frequency at the antiresonance point is an antiresonance frequency. The notch filter section 1103 is configured such that the resonance frequency of the first parallel piezoelectric resonator 1105a and the second parallel piezoelectric resonator 1105b are substantially equal to the antiresonance frequency of the series piezoelectric resonator 1104. Thus, the notch filter section 1103 has a characteristic of a notch filter, in which an attenuation band is a frequency band between the antiresonance frequency of the series piezoelectric resonator 1104 and the resonance frequency of the first parallel piezoelectric resonator 1105a and the second parallel piezoelectric resonator 1105b. Moreover, in order to perform impedance matching for the low-pass side of the passband, the notch filter 1002 shown in FIG. 12 is such that the input matching circuit section 1102a and the output matching circuit section 1102b are respectively positioned at the input side and the output side of the notch filter section 1103 so as to be symmetrical about the notch filter section 1103.

FIG. 14 is a diagram showing a pass characteristic of the notch filter 1002 of conventional art. FIG. 14(a) is a diagram showing the pass characteristic in a range from −60 to 0 dB, and FIG. 14(b) is a diagram showing the pass characteristic in a range from −1.2 to 0 dB. A pass characteristic 1401 (characteristic represented by a heavy line in FIG. 14) of the notch filter 1002 is a characteristic in which frequencies in a mobile telephone transmission frequency band B (830 to 840 MHz), which is an attenuation band, are largely attenuated. A pass characteristic 1402 (characteristic represented by a thin line in FIG. 14) of the notch filter 1002 is a characteristic in which pass loss of frequencies in frequency band A (470 to 770 MHz) for digital television broadcast, which is the passband, is reduced.

FIG. 13 is an equivalent circuit diagram of the low-pass filter 1003 of conventional art. In the low-pass filter 1003, a first series inductor 1202a, a second series inductor 1202b, and a third series inductor 1202c are connected in series in this order between an input terminal 1201a and an output terminal 1201b. One end of the first parallel inductor 1203a is connected to a connection point between the input terminal 1201a and the first series inductor 1202a, and the other end of the first parallel inductor 1203a is connected to one end of a first parallel capacitor 1204a. One end of the second parallel inductor 1203b is connected to a connection point between the first series inductor 1202a and the second series inductor 1202b, and the other end of the second parallel inductor 1203b is connected to one end of a second parallel capacitor 1204b. One end of the third parallel inductor 1203c is connected to a connection point between the second series inductor 1202b and the third series inductor 1202c, and the other end of the third parallel inductor 1203c is connected to one end of a third parallel capacitor 1204c. One end of the fourth parallel inductor 1203d is connected to a connection point between the third series inductor 1202c and the output terminal 1201b, and the other end of the fourth parallel inductor 1203d is connected to one end of a fourth parallel capacitor 1204d. Note that the other ends of the first parallel capacitor 1204a, the second parallel capacitor 1204b, the third parallel capacitor 1204c, and the fourth parallel capacitor 1204d are grounded.

In the low-pass filter 1003, the first series inductor 1202a, the second series inductor 1202b, and the third series inductor 1202c are connected in series between the input terminal 1201a and the output terminal 1201b. Thus, the low-pass filter 1003 allows a signal to pass as the frequency of the signal becomes low, as indicated by impedance $j2\pi$ fL (f: frequency, L: inductance value) of an inductor. On the other hand, the first parallel inductor 1203a and the first parallel capacitor 1204a cause series LC resonance when the frequency of a signal is high, and form a first attenuation pole at a resonance frequency represented by $1/\{2\pi\sqrt{(LC)}\}$ (L: inductance value, C: capacitor value). Similarly, the second parallel inductor 1203b and the second parallel capacitor 1204b form a second attenuation pole; the third parallel inductor 1203c and the third parallel capacitor 1204c form a third attenuation pole; and the fourth parallel inductor 1203d and the fourth parallel capacitor 1204d form a fourth attenuation pole. Thus, the low-pass filter 1003 has a low-pass filter characteristic which allows signals having frequencies in a low-frequency band to pass, and which has four attenuation poles in a high-frequency band.

FIG. 15 is a diagram showing a pass characteristic of the low-pass filter 1003 of conventional art. FIG. 15(a) is a diagram showing the pass characteristic in a range from −80 to 0 dB, and FIG. 15(b) is a diagram showing the pass characteristic in a range from −4 to 0 dB. A pass characteristic 1501 (characteristic represented by a heavy line in FIG. 15) of the low-pass filter 1003 is a characteristic in which frequencies in a band of other systems, and harmonics, which frequencies and harmonics are interfering waves, are largely attenuated. A pass characteristic 1502 (characteristic represented by a thin line in FIG. 15) of the low-pass filter 1003 is a characteristic in which pass loss of frequencies in the frequency band A (470 to 770 MHz) for digital television broadcast, which is the passband, is reduced. A filter as described above which is used, in a mobile telephone terminal, for receiving digital television broadcast, is disclosed in Patent Document 1, for example.

Moreover, it is disclosed that a receiving apparatus using a low-pass filter causes a filter control section to switch a filter characteristic of a low-pass filter in accordance with purposes (see Patent Document 2).

Patent Document 1: Japanese Laid-Open Patent Publication No. 2007-202136
Patent Document 2: International Publication No. 2007/111311 Pamphlet

DISCLOSURE OF THE INVENTION

Problems to be Solved by the Invention

However, a configuration of a high-frequency filter including the notch filter 1002 and the low-pass filter 1003 of conventional art has a problem that pass loss in a frequency band for digital television broadcast is increased because frequencies in a mobile telephone transmission frequency band of the mobile terminal, or frequencies in a band of other systems, the frequencies in these band being interfering waves, are largely attenuated. On the other hand, if pass loss in a frequency band for digital television broadcast is reduced, the attenuation amounts in a mobile telephone transmission frequency band of the mobile terminal, and frequencies in a band of other systems, the frequencies in these band being interfering waves, are decreased, and as a result, performance of reception of digital television broadcast is deteriorated.

Therefore, an object of the present invention is to provide a high-frequency filter which: largely attenuates frequencies in a mobile telephone transmission frequency band of the mobile terminal, and frequencies in a band of other systems, the frequencies in these band being interfering waves; and at the same time, allows frequencies in a passband which is a frequency band for digital television broadcast to pass with low loss.

Solution to the Problems

To achieve the above objects, a high-frequency filter of the present invention is a high-frequency filter whose passband is a predetermined frequency band for digital television broadcast, and whose stopband is a mobile telephone terminal transmission band which is near to the passband, the high-frequency filter comprising: a notch filter including: a first characteristic having predetermined pass loss in the passband, and having a predetermined attenuation amount in the stopband; and a second characteristic having a passband narrower than the predetermined frequency band, and having, in the stopband, an attenuation amount larger than the predetermined attenuation amount; a low-pass filter including: a first characteristic which has an attenuation pole set to be near to the stopband, and thereby has, in the stopband, an attenuation amount larger than the predetermined attenuation amount; and a second characteristic which has an attenuation pole set to be distant from the stopband, and thereby has, in the passband which is the predetermined frequency band, pass loss smaller than the predetermined pass loss; and a control section which, if a channel selected by a user is a low-band channel that is within the passband and on a lower-frequency side of a threshold frequency in the passband, operates the notch filter and the low-pass filter by combining the first characteristic of the notch filter and the first characteristic of the low-pass filter, and if the channel selected by the user is a high-band channel that is within the passband and on a higher-frequency side of the threshold frequency in the passband, operates the notch filter and the low-pass filter by combining the second characteristic of the notch filter and the second characteristic of the low-pass filter.

Preferably, the high-band channel is equal to or higher in local frequency than a channel, a frequency three times as large as a local frequency of the channel coinciding with a frequency in a frequency band from 1710 to 1785 MHz used in a mobile telephone system.

Moreover, preferably, the low-band channel is equal to or lower in local frequency than a channel, a frequency three times as large as a local frequency of the channel coinciding with a frequency in a frequency band from 1477 to 1501 MHz used in a mobile telephone system.

Moreover, preferably, an intermediate frequency is sufficiently low for a local frequency of the selected channel to be substantially equal to a frequency of a desired wave.

Preferably, frequency bands including frequencies equal to integral multiples of frequencies of respective desired waves of the low-band channel and the high-band channel are attenuated.

Preferably, the notch filter includes: a plurality of piezoelectric resonators including at least one series piezoelectric resonator; and a reactance device connected in parallel to the at least one series piezoelectric resonator, and obtains the first characteristic and the second characteristic by changing a reactance value of the reactance device.

Preferably, the low-pass filter includes a plurality of inductors and a plurality of capacitors which cause LC resonance, and obtains the first characteristic and the second characteristic by changing capacitance values of the plurality of capacitors.

Preferably, the reactance device value is changed by a switch being switched to a connected state or an unconnected state.

Preferably, the reactance device is formed by a capacitor.

Preferably, a communication apparatus of the present invention comprises: an antenna transmitting and receiving a high-frequency signal; a filter attenuating, among received signals, a signal having a frequency other than a channel frequency; a low noise amplifier amplifying the signal which has been filtered so as to be faint; and a digital television receiving circuit section demodulating the signal amplified by the low noise amplifier, wherein the above-described high-frequency filter is applied to the filter.

Effect of the Invention

As described above, a high-frequency filter of the present invention makes it possible to: largely attenuate frequencies in a mobile telephone transmission frequency band of the mobile terminal, and frequencies in a band of other systems, the frequencies in these band being interfering waves; and at the same time, allow frequencies in a passband which is a frequency band for digital television broadcast to pass with low loss.

BRIEF DESCRIPTION OF THE DRAWINGS

FIG. 15 is a diagram showing a pass characteristic of the low-pass filter 1003 of conventional art.

Figure 1:
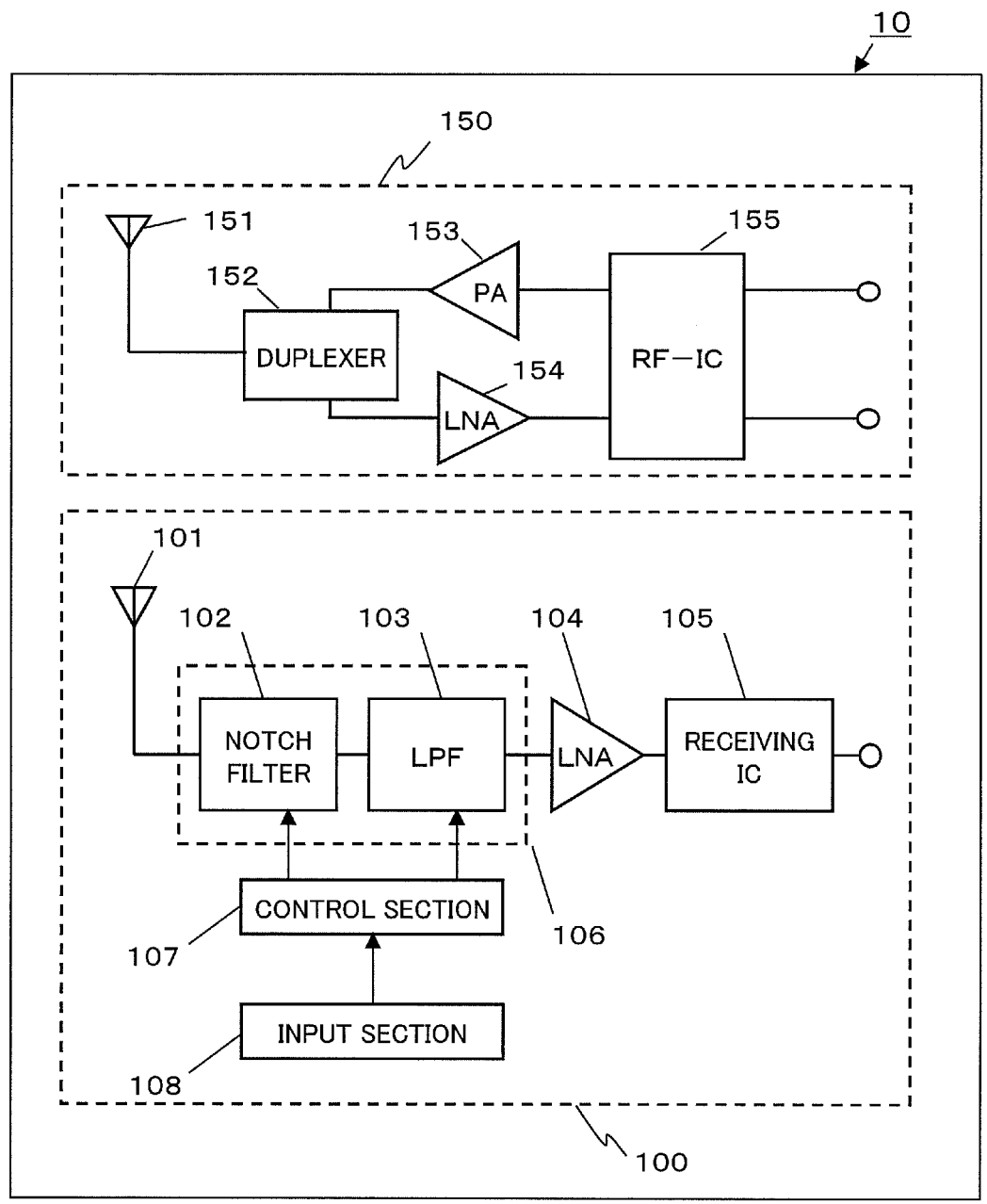
FIG. 1 is a block diagram of a mobile telephone terminal 10 according to a first embodiment of the present invention, which allows digital television broadcast to be watched.

DESCRIPTION OF THE REFERENCE CHARACTERS 10 mobile telephone terminal
100, 1000 digital television broadcast receiving section of mobile telephone terminal
101, 151, 1001 antenna
102, 1002 notch filter
103, 900, 1003 low-pass filter
104, 154, 1004 low noise amplifier
105, 1005 receiving IC
106, 1006 high-frequency filter
107 control section
108 input section
150 call function section of mobile telephone terminal
152 duplexer
153 power amplifier
155 high-frequency circuit
201a, 301a, 901a, 1101a, 1201a input terminal
201b, 301b, 901b, 1101b, 1201b output terminal
202a, 1102a input matching circuit section
202b, 1102b output matching circuit section
203, 1103 notch filter section
204, 1104 series piezoelectric resonator
205a, 205b, 1105a, 1105b parallel piezoelectric resonator
206a, 206b, 302a to 302d, 902a to 902e, 1106a, 1106b, 1202a to 1202c series inductor
207a, 207b, 303a to 303e, 701, 801, 1107a, 1107b, 1203a to 1203d parallel inductor
208, 305a to 305e, 704, 905a to 905e switch
304a to 304e, 306a to 306e, 702, 703, 802, 903a to 903d, 904a to 904e, 906a to 906e, 1204a to 1204d capacitor 401, 402, 501, 502, 601, 602, 601a, 602a, 1401, 1402, 1501, 1502 pass characteristic
705, 804 resistor
706, 805 control terminal
803a variable capacitor diode
803b variable capacitor
A, B, C, D frequency band

BEST MODE FOR CARRYING OUT THE INVENTION

Hereinafter, embodiments of the present invention will be described with reference to the drawings.
(First Embodiment)
FIG. 1 is a block diagram of a mobile telephone terminal 10 according to a first embodiment of the present invention, which allows digital television broadcast to be watched. As shown in FIG. 1, the mobile telephone terminal 10 includes a digital television broadcast receiving section 100, and a call function section 150.

The call function section 150 of the mobile telephone terminal includes an antenna 151, a duplexer 152, a power amplifier (PA) 153, a low noise amplifier (LNA) 154, and a high-frequency circuit (RF-IC) 155. Functions of the components of the call function section 150 of the mobile telephone terminal are the same as those in a conventional mobile telephone, and therefore the description thereof is omitted.

The digital television broadcast receiving section 100 of the mobile telephone terminal includes an antenna 101, a notch filter 102, a low-pass filter (LPF) 103, a low noise amplifier (LNA) 104, a receiving IC 105, a control section 107, and an input section 108.

Figure 11:
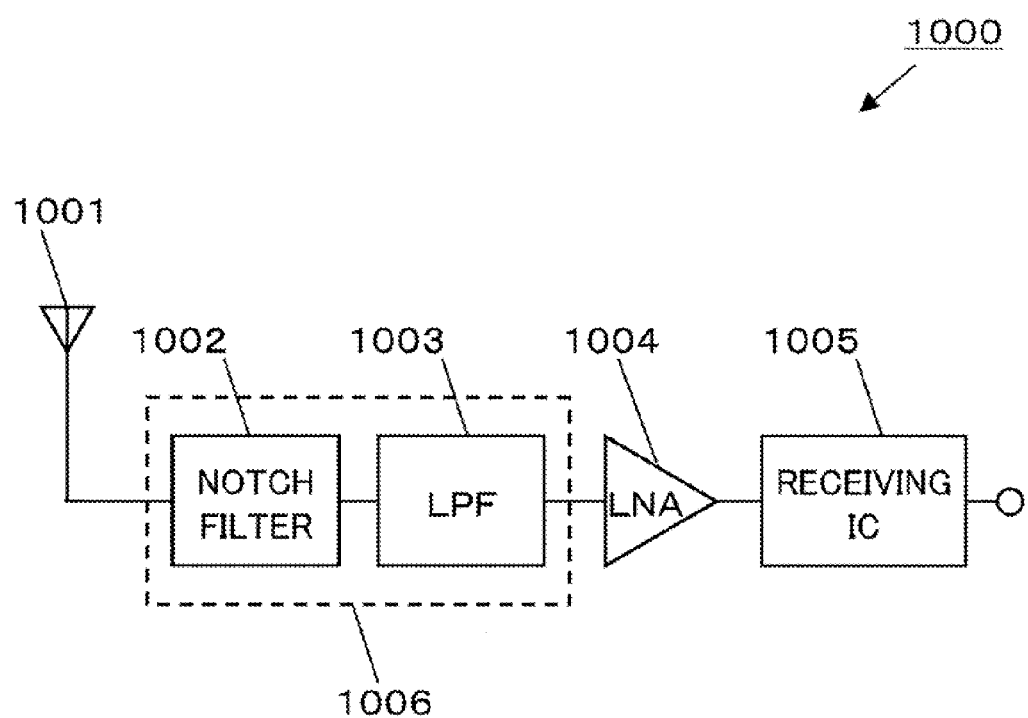
FIG. 11 is a block diagram showing a digital television broadcast receiving section 1000 of a mobile telephone terminal of conventional art, which allows digital television broadcast to be watched.
Figure 12:
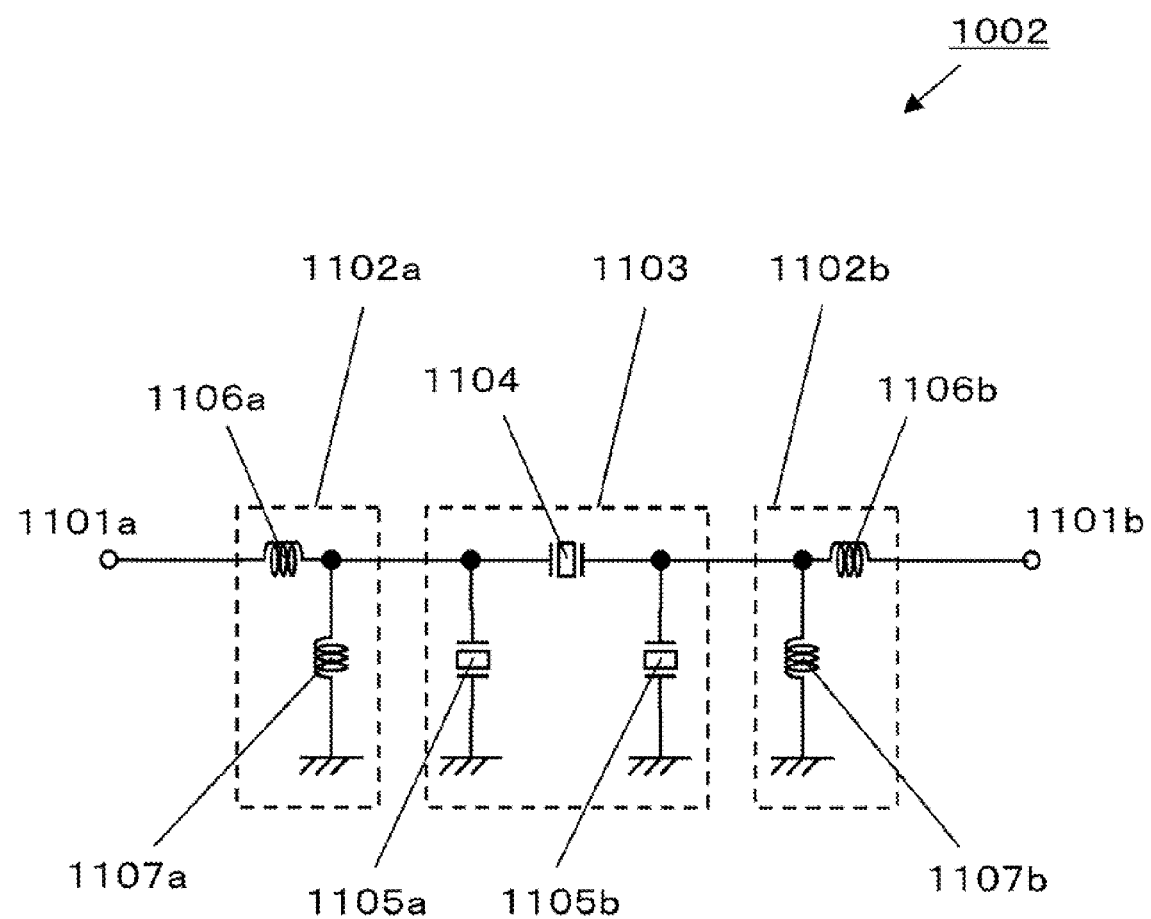
FIG. 12 is an equivalent circuit diagram of a notch filter 1002 of conventional art.
Figure 13:
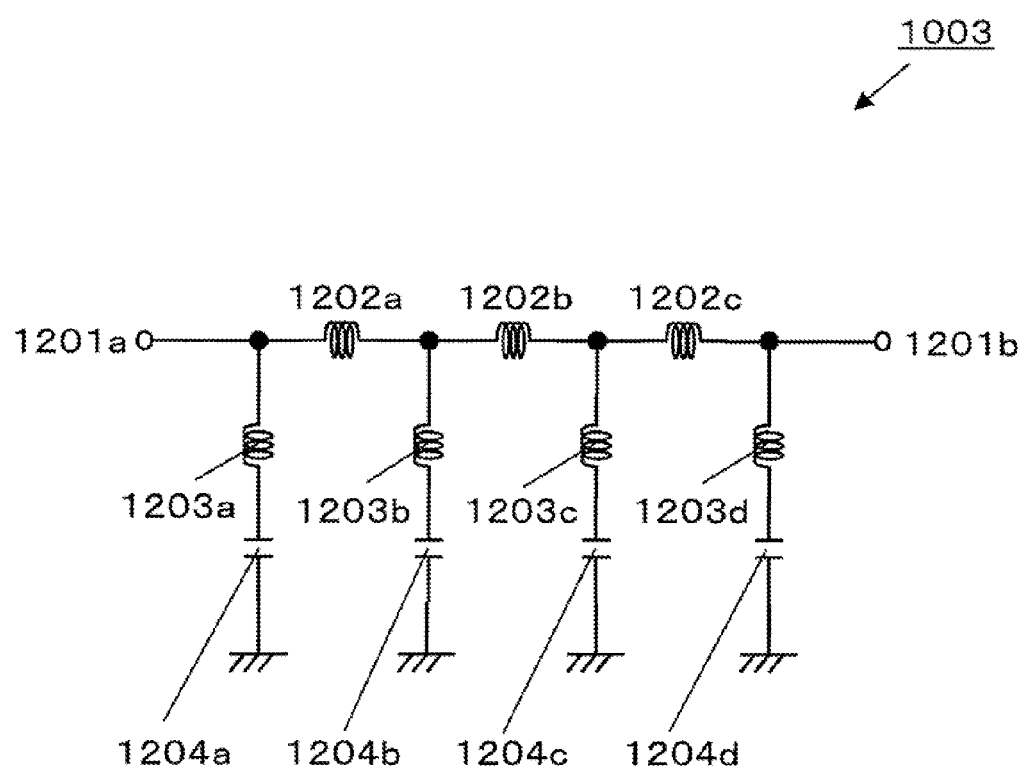
FIG. 13 is an equivalent circuit diagram of a low-pass filter 1003 of conventional art.
Figure 14:
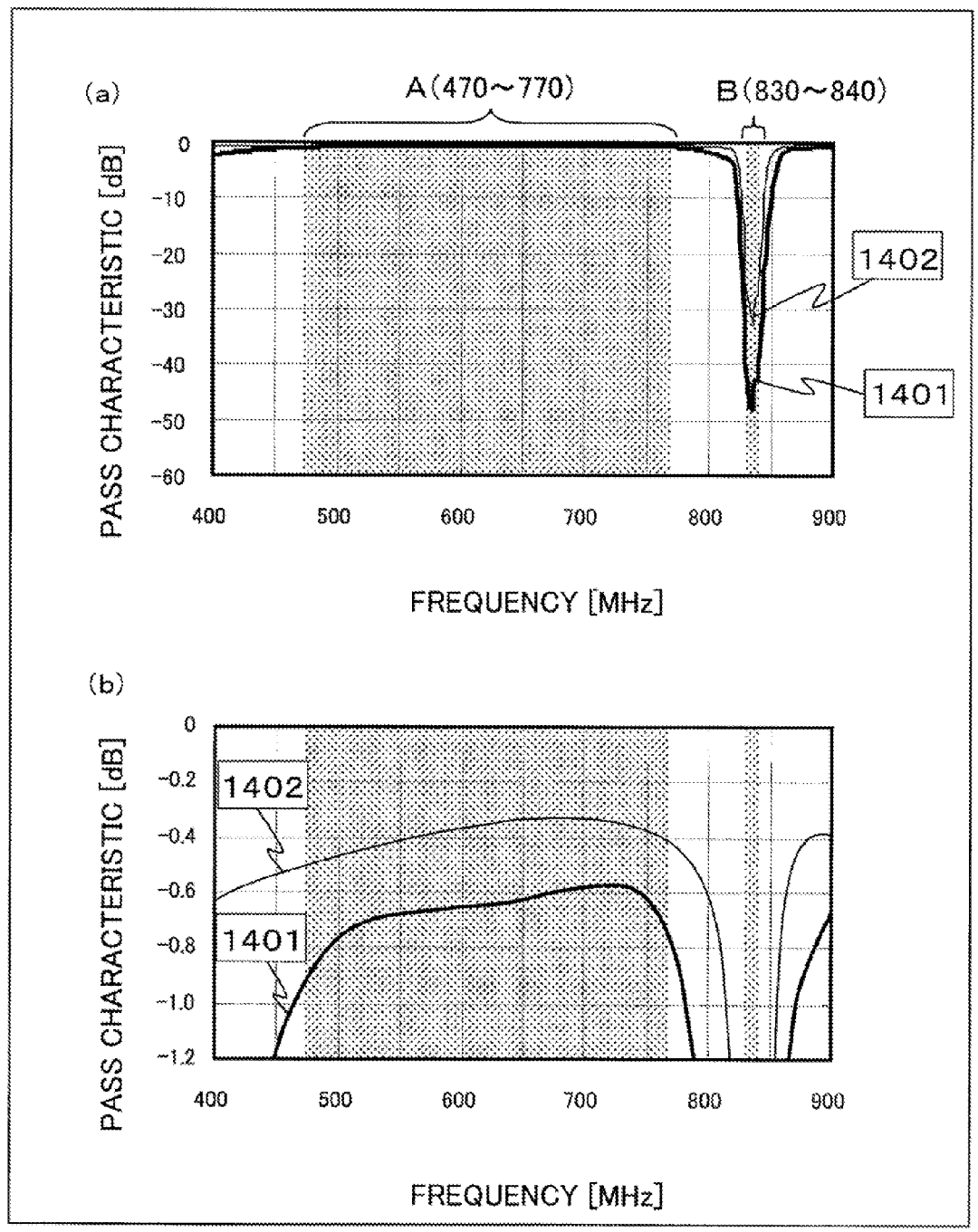
FIG. 14 is a diagram showing a pass characteristic of the notch filter 1002 of conventional art.

A high-frequency signal received via the antenna 101 is filtered by the high-frequency filter 106 formed by the notch filter 102 and the low-pass filter 103. First, among received high-frequency signals, the notch filter 102 largely attenuates frequencies in a mobile telephone transmission frequency band of the mobile telephone terminal, and passes, with low loss, frequencies in a frequency band for digital television broadcast. Next, among high-frequency signals filtered by the notch filter 102, the low-pass filter 103 largely attenuates frequencies in an interfering wave frequency band of other systems, which band is largely distant from the frequency band for digital television broadcast, and passes, with low loss, frequencies in the frequency band for digital television broadcast. High-frequency signals filtered as described above by the notch filter 102 and the low-pass filter 103 are amplified, with low distortion, by the low noise amplifier 104, and then the amplified high-frequency signals are converted to baseband signals by the receiving IC 105. The configuration and operation described thus far are the same as those of the digital television broadcast receiving section 1000 of the mobile telephone terminal of conventional art shown in FIG. 11. The digital television broadcast receiving section 100 according to the first embodiment of the present invention, which allows digital television broadcast to be watched, further includes a control section 107 which controls an operation of the notch filter 102 and an operation of the low-pass filter 103. The control section 107 controls switching of switches in circuits in the notch filter 102 and the low-pass filter 103, which control will be described later. Note that the control section 107 controls the switching, based on, for example, information about a channel selected by a user via the input section 108.

Figure 2:
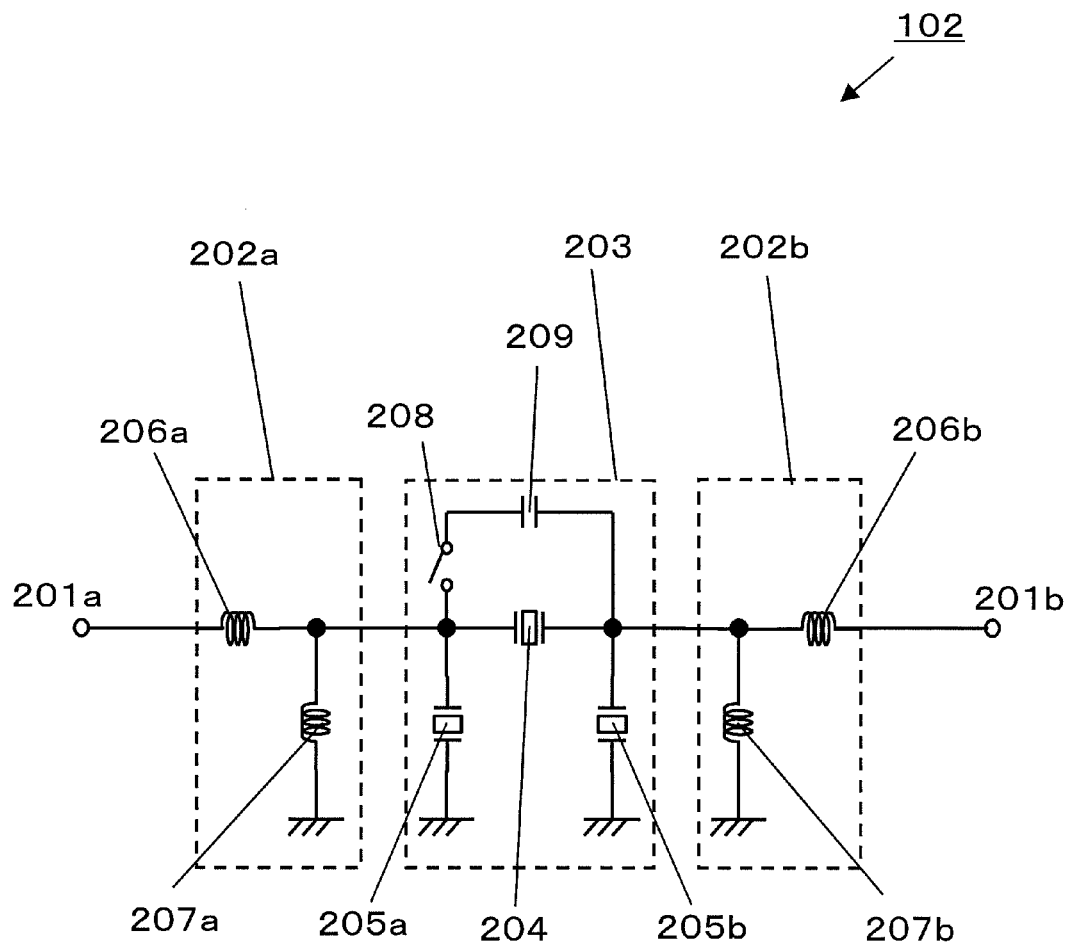
FIG. 2 is an equivalent circuit diagram of a notch filter 102 according to the first embodiment of the present invention.

FIG. 2 is an equivalent circuit diagram of the notch filter 102 according to the first embodiment of the present invention. As shown in FIG. 2, the notch filter 102 includes an input matching circuit section 202a, a notch filter section 203, and an output matching circuit section 202b.

The input matching circuit section 202a includes a series inductor 206a one end of which is connected to an input terminal 201a, and a parallel inductor 207a one end of which is connected to the other end of the series inductor 206a. Note that the other end of the parallel inductor 207a is grounded.

The notch filter section 203 is a π-type three-stage circuit including a series piezoelectric resonator 204, a first parallel piezoelectric resonator 205a, and a second parallel piezoelectric resonator 205b, one end of the first parallel piezoelectric resonator 205a and one end of the second parallel piezoelectric resonator 205b being connected to the respective ends of the series piezoelectric resonator 204. Note that the other end of the first parallel piezoelectric resonator 205a and the other end of the second parallel piezoelectric resonator 205b are grounded. Moreover, one end of a capacitor 209 is connected, via a switch 208, to a connection point between the series piezoelectric resonator 204 and the first parallel piezoelectric resonator 205a. The other end of the capacitor 209 is connected to a connection point between the series piezoelectric resonator 204 and the second parallel piezoelectric resonator 205b. In addition, the connection point between the series piezoelectric resonator 204 and the first parallel piezoelectric resonator 205a is connected to a connection point between the series inductor 206a and the parallel inductor 207a of the input matching circuit section 202a. Note that an SAW (Surface Acoustic Wave Device) or an FGAR (Film Bulk Acoustic Resonator) is used for the above piezoelectric resonators.

The input matching circuit section 202b includes a series inductor 206b one end of which is connected to an output terminal 201b, and a parallel inductor 207b one end of which is connected to the other end of the series inductor 206b. Note that the other end of the parallel inductor 207b is grounded. In addition, a connection point between the series inductor 206b and the parallel inductor 207b is connected to a connection point between the series piezoelectric resonator 204 and the second parallel piezoelectric resonator 205b of the notch filter section 203.

Each of the characteristics of the series piezoelectric resonator 204, the first parallel piezoelectric resonator 205a, and the second parallel piezoelectric resonator 205b alone has a resonance point at which the impedance is 0, and an antiresonance point at which the impedance reaches infinity. A frequency at the resonance point is a resonance frequency, and a frequency at the antiresonance point is an antiresonance frequency. The notch filter section 203 is configured such that the resonance frequency of the first parallel piezoelectric resonator 205a and the second parallel piezoelectric resonator 205b are substantially equal to the antiresonance frequency of the series piezoelectric resonator 204. Thus, the notch filter section 203 has a characteristic of a notch filter in which an attenuation band is a frequency band between the antiresonance frequency of the series piezoelectric resonator 204 and the resonance frequency of the first parallel piezoelectric resonator 205a and the second parallel piezoelectric resonator 205b. Moreover, in order to perform impedance matching for the low-pass side of the passband, the notch filter 102 shown in FIG. 2 is such that the input matching circuit section 202a and the output matching circuit section 202b are respectively positioned at the input side and the output side of the notch filter section 203 so as to be symmetrical about the notch filter section 203. In addition, by the switch 208 being turned on, the capacitance of the capacitor 209 is added to the electrostatic capacitance of the series piezoelectric resonator 204, and an antiresonance frequency of the series piezoelectric resonator 204, at which an attenuation pole is formed, is shifted toward lower frequency side. As a result, the attenuation amounts of frequencies in a stopband which is a mobile telephone transmission frequency band of the mobile telephone terminal are decreased in comparison with the case where the switch 208 is turned off. Meanwhile, a passband expands toward the lower frequency direction owing to increase in series capacitance.

Figure 4:
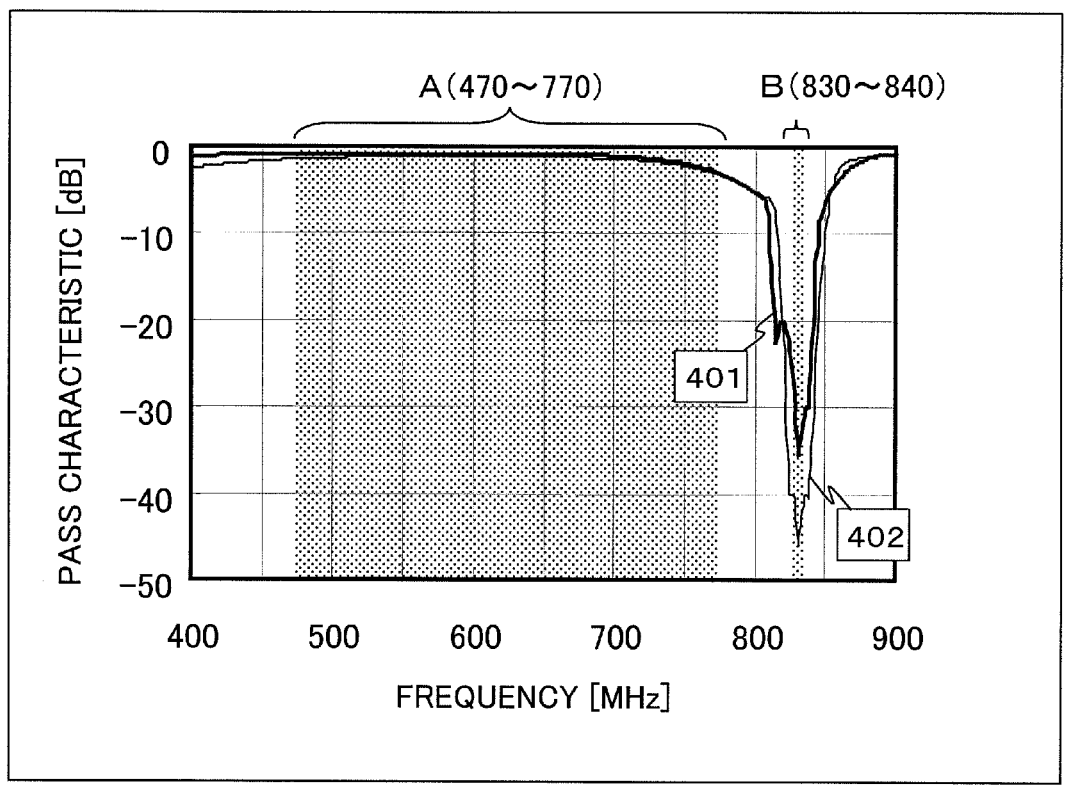
FIG. 4 is a diagram showing a pass characteristic of the notch filter 102 according to the first embodiment of the present invention.

FIG. 4 is a diagram showing a pass characteristic of the notch filter 102 according to the first embodiment of the present invention. In FIG. 4, a pass characteristic 401 (characteristic represented by a heavy line in FIG. 4) indicates a characteristic obtained in the case where, by the switch 208 of the notch filter 102 being turned on, the series piezoelectric resonator 204 is connected in parallel to the capacitor 209. In the pass characteristic 401, it is found that the attenuation amounts of frequencies in a stopband which is a mobile telephone transmission frequency band B (830 to 840 MHz) of the mobile telephone terminal are decreased, and that pass loss of frequencies in a passband A (470 to 770 MHz) for digital television broadcast is reduced. The pass characteristic 402 (characteristic represented by a thin line in FIG. 4) indicates a characteristic obtained in the case where: the switch 208 of the notch filter 102 is turned off; and the capacitor 209 is not connected to the series piezoelectric resonator 204. On the other hand, in the pass characteristic 402, it is found that the attenuation amounts of frequencies in the stopband which is the mobile telephone transmission frequency band B of the mobile telephone terminal are increased, and that pass loss of frequencies in a lower frequency portion of the passband A for digital television broadcast is increased.

Figure 3:
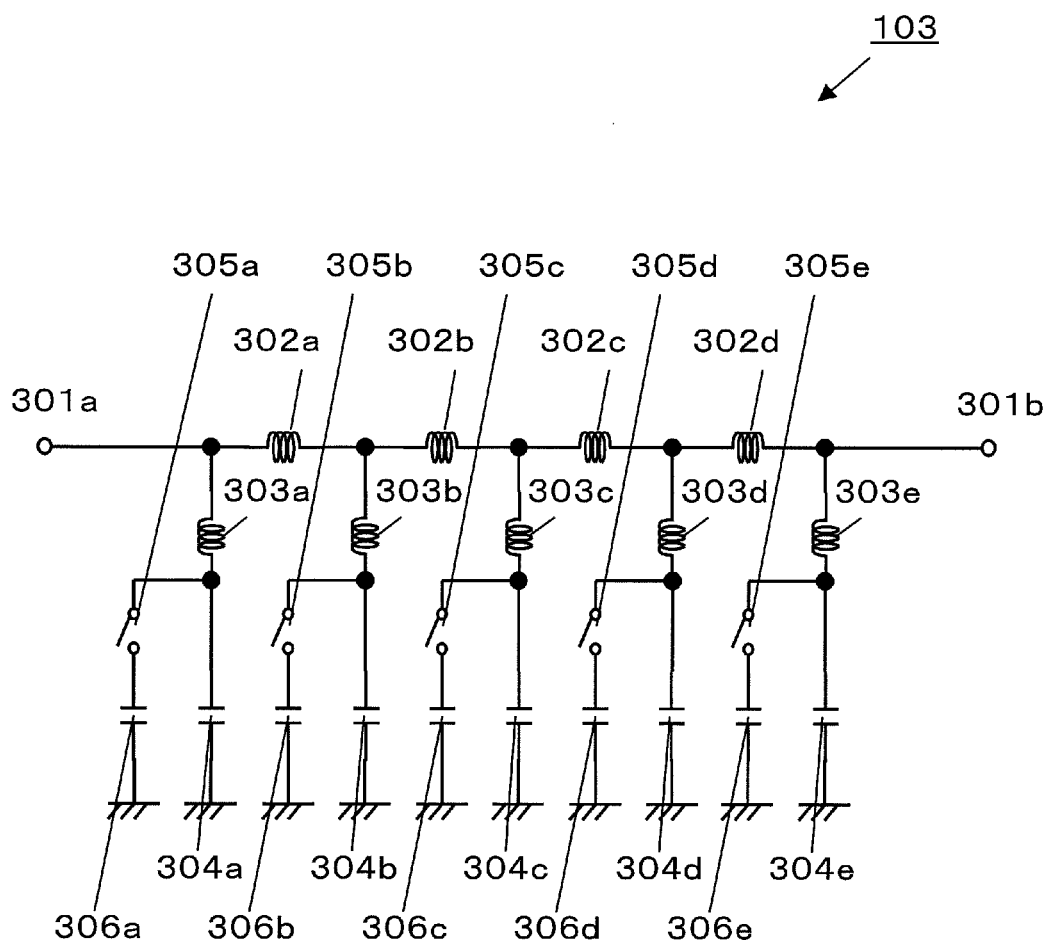
FIG. 3 is an equivalent circuit diagram of a low-pass filter 103 according to the first embodiment of the present invention.

FIG. 3 is an equivalent circuit diagram of the low-pass filter 103 according to the first embodiment of the present invention. In the low-pass filter 103, a first series inductor 302a, a second series inductor 302b, a third series inductor 302c, and a fourth series inductor 302d are connected in series in this order between an input terminal 301a and an output terminal 301b. One end of the first parallel inductor 303a is connected to a connection point between the input terminal 301a and the first series inductor 302a, and the other end of the first parallel inductor 303a is connected to one end of a first parallel capacitor 304a. One end of the second parallel inductor 303b is connected to a connection point between the first series inductor 302a and the second series inductor 302b, and the other end of the second parallel inductor 303b is connected to one end of a second parallel capacitor 304b. One end of the third parallel inductor 303c is connected to a connection point between the second series inductor 302b and the third series inductor 302c, and the other end of the third parallel inductor 303c is connected to one end of a third parallel capacitor 304c. One end of the fourth parallel inductor 303d is connected to a connection point between the third series inductor 302c and the fourth series inductor 302d, and the other end of the fourth parallel inductor 303d is connected to one end of a fourth parallel capacitor 304d. One end of the fifth parallel inductor 303e is connected to a connection point between the fourth series inductor 302d and the output terminal 301b, and the other end of the fifth parallel inductor 303e is connected to one end of a fifth parallel capacitor 304e. Note that the other ends of the first parallel capacitor 304a, the second parallel capacitor 304b, the third parallel capacitor 304c, the fourth parallel capacitor 304d, and the fifth parallel capacitor 304e are grounded.

Moreover, one end of a first additional parallel capacitor 306a is connected, via a first switch 305a, to a connection point between the first parallel inductor 303a and the first parallel capacitor 304a. One end of a second additional parallel capacitor 306b is connected, via a second switch 305b, to a connection point between the second parallel inductor 303b and the second parallel capacitor 304b. One end of a third additional parallel capacitor 306c is connected, via a third switch 305c, to a connection point between the third parallel inductor 303c and the third parallel capacitor 304c. One end of a fourth additional parallel capacitor 306d is connected, via a fourth switch 305d, to a connection point between the fourth parallel inductor 303d and the fourth parallel capacitor 304d. One end of a fifth additional parallel capacitor 306e is connected, via a fifth switch 305e, to a connection point between the fifth parallel inductor 303e and the fifth parallel capacitor 304e. Note that the other ends of the first additional parallel capacitor 306a, the second additional parallel capacitor 306b, the third additional parallel capacitor 306c, the fourth additional parallel capacitor 306d, and the fifth additional parallel capacitor 306e are grounded.

In the low-pass filter 103, the first series inductor 302a, the second series inductor 302b, the third series inductor 302c, and the fourth series inductor 302d are connected in series between the input terminal 301a and the output terminal 301b. Thus, the low-pass filter 103 allows a signal to pass as the frequency of the signal becomes low, as indicated by impedance $j2\pi$ fL (f: frequency, L: inductance value) of an inductor. On the other hand, the first parallel inductor 303a and the first parallel capacitor 304a cause series LC resonance when the frequency of a signal is high, and form a first attenuation pole at a resonance frequency represented by $1/\{2\pi\sqrt{(LC)}\}$ (L: inductance value, C: capacitor value). Similarly, the second parallel inductor 303b and the second parallel capacitor 304b form a second attenuation pole; the third parallel inductor 303c and the third parallel capacitor 304c form a third attenuation pole; the fourth parallel inductor 303d and the fourth parallel capacitor 304d form a fourth attenuation pole; and the fifth parallel inductor 303e and the fifth parallel capacitor 304e form a fifth attenuation pole. Thus, the low-pass filter 103 has a low-pass filter characteristic in which: the low-pass filter 103 allows signals having frequencies in a low-frequency band to pass; and has five attenuation poles in a high-frequency band.

Moreover, by the first to fifth switches 305a to 305e being turned on, each of combined capacitances which are obtained by combining the first to fifth parallel capacitors 304a to 304e respectively with the first to fifth additional parallel capacitors 306a to 306e causes series LC resonance, and the respective attenuation poles are shifted by degrees corresponding to the first to fifth additional parallel capacitors 306a to 306e, toward lower frequency side. As a result, in comparison with the case where the first to fifth switches 305a to 305e are turned off, the attenuation poles approach the stopband which is a mobile telephone transmission frequency band of the mobile telephone terminal.

Figure 5:
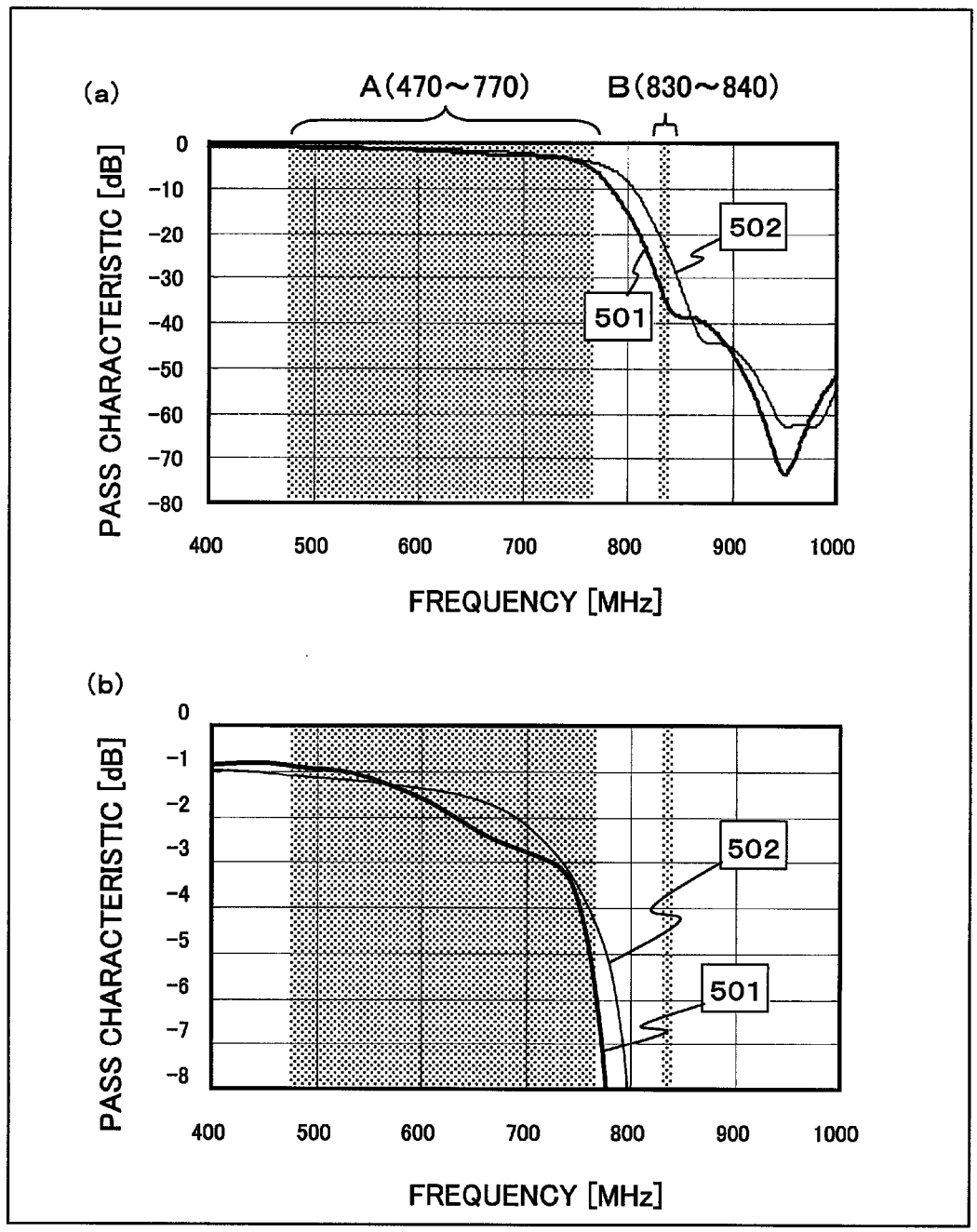
FIG. 5 is a diagram showing a pass characteristic of the low-pass filter 103 according to the first embodiment of the present invention.

FIG. 5 is a diagram showing a pass characteristic of the low-pass filter 103 according to the first embodiment of the present invention. FIG. 5(a) is a diagram showing the pass characteristic in a range from −80 to 0 dB, and FIG. 5(b) is a diagram showing the pass characteristic in a range from −4 to 0 dB. In FIG. 5, a pass characteristic 501 (characteristic represented by a heavy line in FIG. 5) indicates a characteristic obtained in the case where, by the first to fifth switches 305a to 305e of the low-pass filter 103 being turned on, the first to fifth additional parallel capacitors 306a to 306e are connected to the respective connection points. A pass characteristic 502 (characteristic represented by a thin line in FIG. 5) indicates a characteristic obtained in the case where: the first to fifth switches 305a to 305e of the low-pass filter 103 are turned off; and the first to fifth additional parallel capacitors 306a to 306e are not connected to the respective connection points. In the pass characteristic 501, it is found that, by the attenuation poles approaching the stopband which is the mobile telephone transmission frequency band B (830 to 840 MHz) of the mobile telephone terminal, the attenuation amounts of frequencies in the stopband are increased, and that pass loss of frequencies in a higher frequency portion of the passband A (470 to 770 MHz) for digital television broadcast is increased. On the other hand, in the pass characteristic 502, it is found that, by the attenuation poles becoming distant from the stopband which is a mobile telephone transmission frequency band B of the mobile telephone terminal, the attenuation amounts of frequencies in the stopband are decreased, and that pass loss of frequencies in the passband A for digital television broadcast is reduced.

Figure 6:
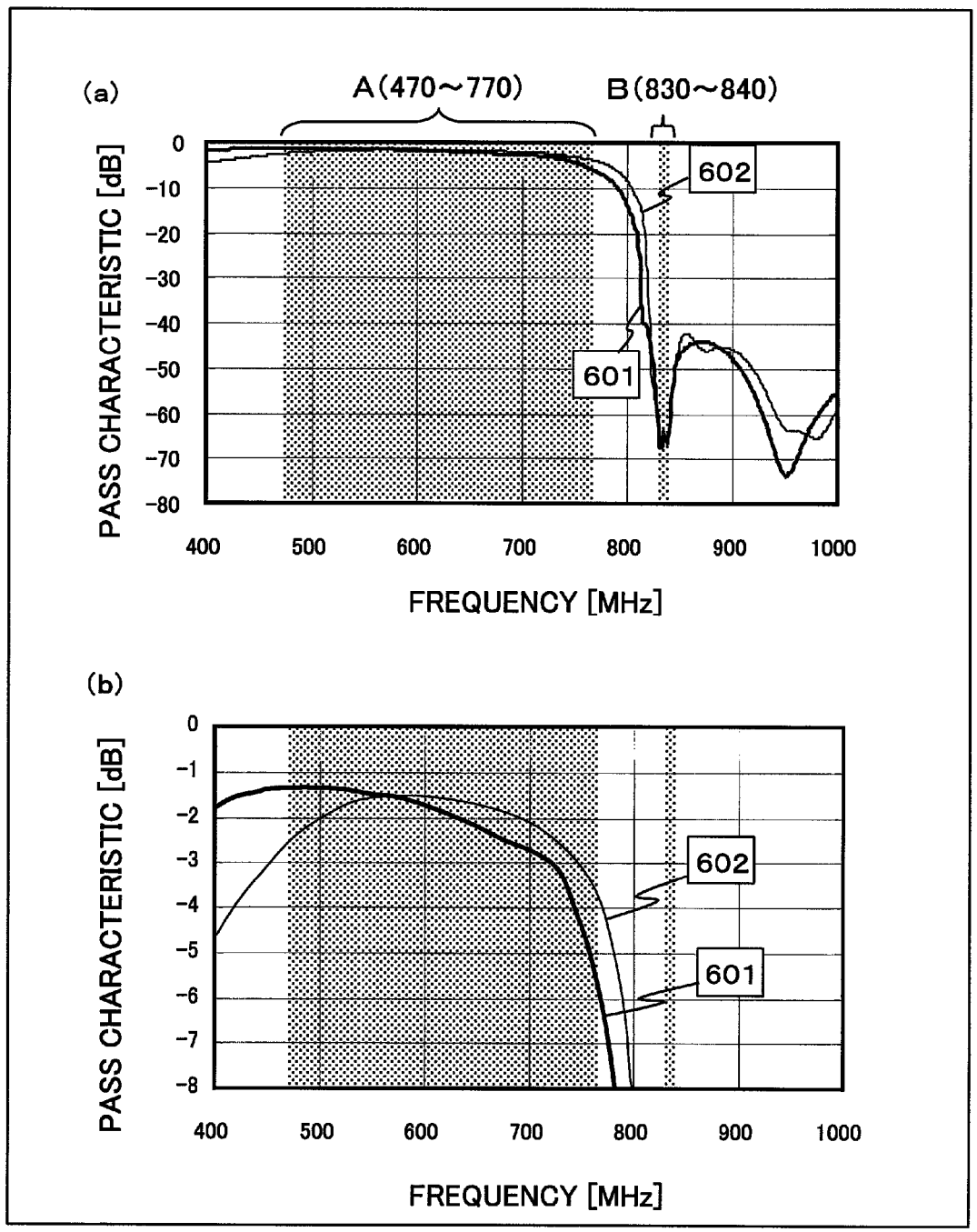
FIG. 6 is a diagram showing a pass characteristic of a high-frequency filter 106 according to the first embodiment of the present invention.

FIG. 6 is a diagram showing a pass characteristic of the high-frequency filter 106 according to the first embodiment of the present invention, the high-frequency filter 106 being formed by the notch filter 102 and the low-pass filter 103. FIG. 6(a) is a diagram showing the pass characteristic in a range from −80 to 0 dB, and FIG. 6(b) is a diagram showing the pass characteristic in a range from −4 to 0 dB. In FIG. 6, a pass characteristic 601 (characteristic represented by a heavy line in FIG. 6) indicates a characteristic of the high-frequency filter 106, which is obtained in the case where: the switch 208 of the notch filter 102 is turned on; and the first to fifth switches 305a to 305e of the low-pass filter 103 are turned on. A pass characteristic 602 (characteristic represented by a thin line in FIG. 6) indicates a characteristic of the high-frequency filter 106, which is obtained in the case where: the switch 208 of the notch filter 102 is turned off; and the first to fifth switches 305a to 305e of the low-pass filter 103 are turned off.

Firstly, the pass characteristic 601 will be described in detail. The control section 107 turns on the switch 208 of the notch filter 102. As a result, the pass characteristic of the notch filter 102 is such that loss of frequencies in the passband A for digital television broadcast is reduced as in the pass characteristic 401 in FIG. 4 and the attenuation amounts of frequencies in the stopband which is the mobile telephone transmission frequency band B are decreased. Here, in order to compensate the attenuation amounts of frequencies in the stopband, which have been decreased by the notch filter 102, the control section 107 turns on the first to fifth switches 305a to 305e of the low-pass filter 103. As a result, the pass characteristic of the low-pass filter 103 is such that the attenuation poles are shifted toward lower frequency side as in the pass characteristic 501 in FIG. 5. Thus, the pass characteristic 601 is a characteristic obtained by a combination of the pass characteristic 401 of the notch filter 102 and the pass characteristic 501 of the low-pass filter 103.

Next, the pass characteristic 602 will be described in detail. The control section 107 turns off the switch 208 of the notch filter 102. As a result, the pass characteristic of the notch filter 102 is such that loss of frequencies in the passband A for digital television broadcast is increased as in the pass characteristic 402 in FIG. 4 and the attenuation amounts of frequencies in the stopband which is the mobile telephone transmission frequency band B are increased. Here, the attenuation amounts of frequencies in the stopband is obtained sufficiently from the pass characteristic 402 of the notch filter 102. Therefore, in order to reduce pass loss of frequencies in the passband, the control section 107 turns off the first to fifth switches 305a to 305e of the low-pass filter 103. As a result, the pass characteristic of the low-pass filter 103 is such that pass loss of frequencies in the passband is reduced as in the pass characteristic 502 in FIG. 5. Thus, the pass characteristic 602 is a characteristic obtained by a combination of the pass characteristic 402 of the notch filter 102 and the pass characteristic 502 of the low-pass filter 103.

Here, in each of the pass characteristic 601 and the pass characteristic 602, the attenuation amounts of frequencies in the stopband which is the mobile telephone transmission frequency band B are increased. However, in the pass characteristic 601, pass loss of frequencies in a higher frequency portion of the wide passband A for digital television broadcast is increased, and in the pass characteristic 602, pass loss of frequencies in a lower frequency portion of the wide passband A is increased. Accordingly, a wide band for digital television broadcast, which includes channels 13 to 62 is divided into two bands, and the lower-frequency band and the higher-frequency band of the two bands are referred to as a low-band channel and a high-band channel, respectively. When a signal of the low-band channel is received, the control section 107 turns on the switch 208 of the notch filter 102 and the first to fifth switches 305a to 305e of the low-pass filter 103, whereby the pass characteristic of the high-frequency filter is controlled to be the pass characteristic 601. When a signal of the high-band channel is received, the control section 107 turns off the switch 208 of the notch filter 102 and the first to fifth switches 305a to 305e of the low-pass filter 103, whereby the pass characteristic of the high-frequency filter is controlled to be the pass characteristic 602.

As described above, in the high-frequency filter 106 according to the first embodiment of the present invention, the passband for digital television broadcast is divided into several parts. The control section switches a characteristic of each of the notch filter 102 and the low-pass filter 103 so as to combine filters appropriate for a low-band channel or a high-band channel. Thus, frequencies in a mobile telephone transmission frequency band of the mobile terminal, and frequencies in a band of other systems, the frequencies in these band being interfering waves, are largely attenuated, and at the same time, frequencies in the passband which is a frequency band for digital television broadcast are allowed to pass with low loss.

Figure 7:
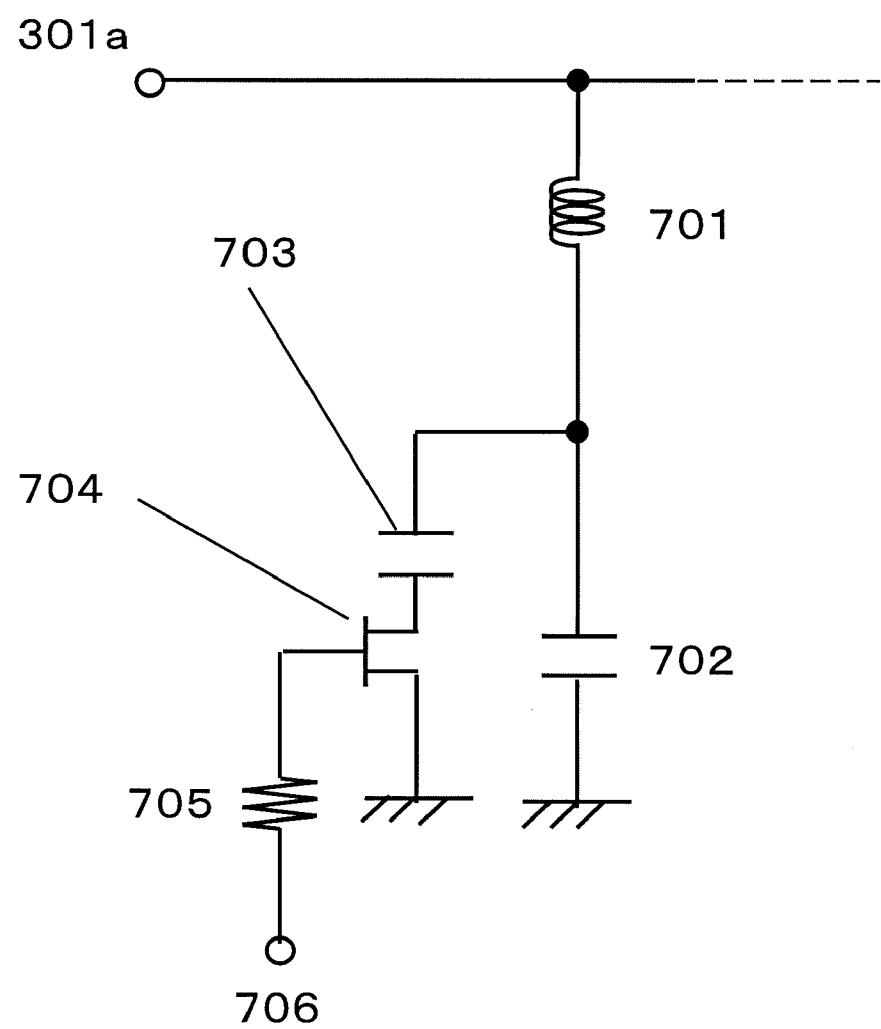
FIG. 7 is a diagram showing a specific example of a part of the low-pass filter 103 according to the first embodiment of the present invention.

Note that in circuit diagrams in FIG. 2 and FIG. 3, the switches are illustrated in a simple manner. Switches and variable capacitors will be described in detail by using, as an example, a series LC circuit section at the first stage in the low-pass filter 103 shown in FIG. 3. FIG. 7 is a diagram showing the series LC circuit section at the first stage in the low-pass filter 103 shown in FIG. 3. As shown in FIG. 7, one end of a parallel inductor 701 is connected to the input terminal 301a, and the other end is connected to one end of a parallel capacitor 702. The other end of the parallel capacitor 702 is wounded. One end of the semiconductor switch 704 is connected, via an additional parallel capacitor 703, to a connection point between the parallel inductor 701 and the parallel capacitor 702, the additional parallel capacitor 703 being also used for blocking a direct current signal. In addition, the other end of the semiconductor switch 704 is grounded. For the purpose of turning on or off the semiconductor switch 704, a control terminal 706 is connected, via a resistor 705, to the semiconductor switch 704. Here, when the semiconductor switch 704 is turned off, only the capacitance of the parallel capacitor 702 causes series LC resonance, and when the semiconductor switch 704 is turned on, a combined capacitance obtained by combining the parallel capacitor 702 and the additional parallel capacitor 703 causes series LC resonance. Thus, a capacitance which causes series LC resonance is changed, and an attenuation pole is formed in accordance with the capacitance. Note that instead of a semiconductor switch, a MEMS-SW may be used for a switch as described above.

Moreover, a circuit using a variable capacitor device or a variable capacitor diode is conceivable as a circuit in which a capacitance causing series LC resonance is changed and an attenuation pole is formed in accordance with the capacitance. FIG. 8(a) is a diagram of a circuit using a variable capacitor diode. As shown in FIG. 8(a), one end of a parallel inductor 801 is connected to the input terminal 301a, and the other end is connected to one end of a parallel capacitor 802. The other end of the parallel capacitor 802 is connected to the cathode of the variable capacitor diode 803a. The anode of the variable capacitor diode 803a is grounded. In addition, a control terminal 805 is connected, via a resistor 804, to a connection point between the parallel capacitor 802 and the variable capacitor diode 803a. Here, a combined capacitance obtained by combining the variable capacitor diode 803a and the parallel capacitor 802 causes series LC resonance. The capacitance value of the variable capacitor diode 803a is changed by a change of a bias applied by the control terminal 805, and an attenuation pole is formed in accordance with the capacitance value. FIG. 8(b) is a diagram in which a variable capacitor 803b is used instead of the variable capacitor diode 803a shown in FIG. 8(a). The variable capacitor 803b shown in FIG. 8(b) is parallel plane plates made of ferroelectric material thin films such as Barium Strontium Titanate (BaxSr1-xTiO3). The capacitance value of the variable capacitor 803b is continuously changed by a change of a bias applied by the control terminal 805, and an attenuation pole is formed in accordance with the capacitance value.

Figure 8:
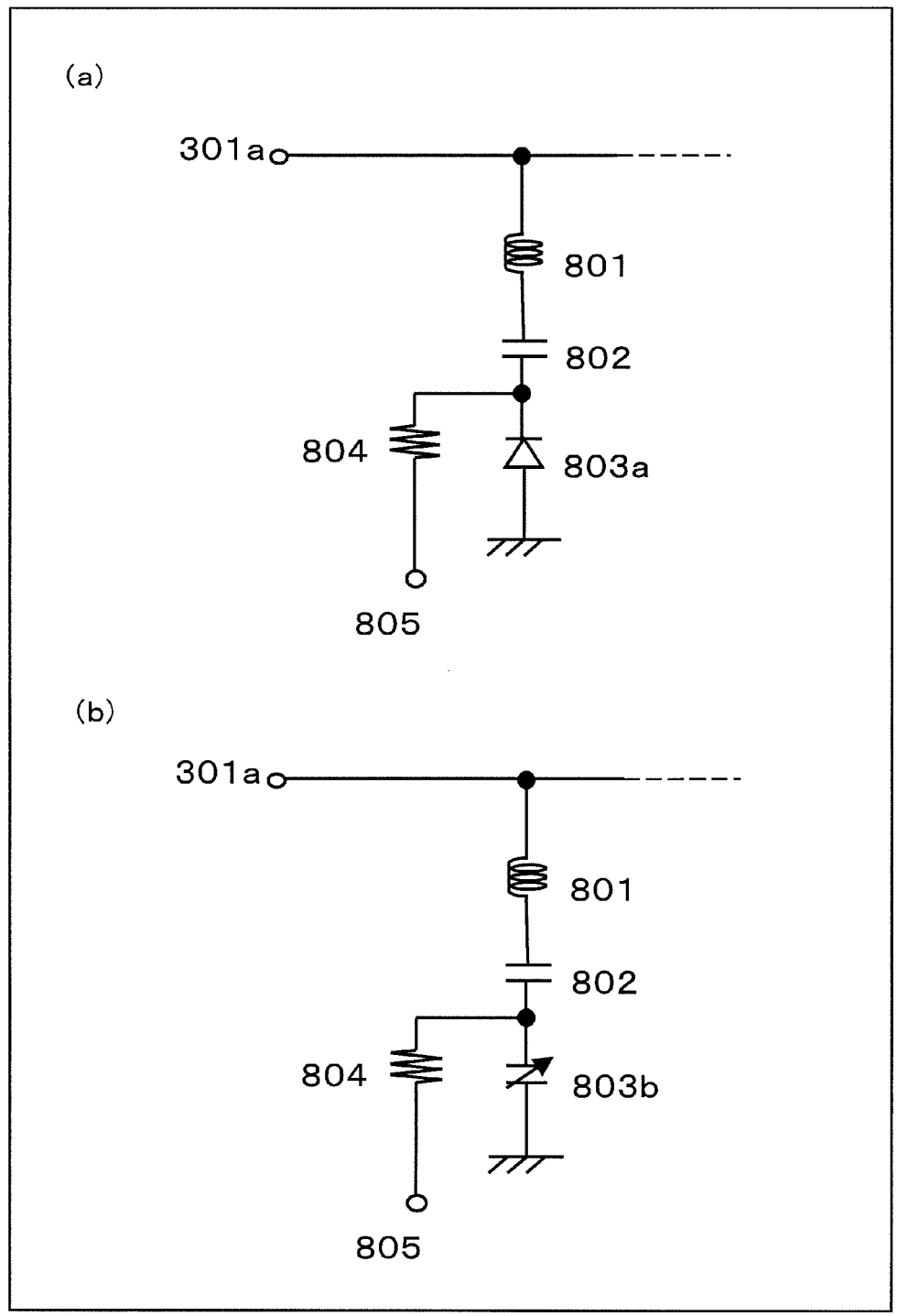
FIG. 8 is a diagram showing a specific example of a part of the low-pass filter 103 according to the first embodiment of the present invention.

Although, in FIG. 7 and FIG. 8, a series LC circuit section at the first stage in the low-pass filter 103 shown in FIG. 3 is described as an example, it is understood that the switches illustrated in a simple manner in FIG. 2 and FIG. 3 provide the same effect as in FIG. 7 and FIG. 8.

In addition, in the first embodiment according to the present invention, since all the switches are operated at the same time, one control terminal controlled by the control section 107 can be commonly used for all the switches. A configuration in which all the switches are operated by the control section 107 performing one operation of control enables control circuitry and control terminals to be reduced, and also, has advantage to reduce the size of a filter circuit. In addition, it is not necessary to operate all of the first to fifth switches 305a to 305e in the low-pass filter 103, and among them, only a switch corresponding to a desired characteristic may be operated. Depending on a desired characteristic, one of the first to fifth switches 305a to 305e may be turned on to shift an attenuation pole toward lower-frequency side when a signal of the high-band channel is received. In this case, different control terminals are controlled by the control section 107.

In addition, depending on a desired characteristic, the first to fourth series inductors 302a to 302d in the low-pass filter 103 have extremely small inductance and the characteristic is not changed even if the first to fourth series inductors 302a to 302d are removed. In this case, it is understood that, even if the inductors are removed and short circuits are caused, the same effect as in the case where the inductors are not removed is obtained.

In addition, although five stages of series LC resonance are provided in the low-pass filter 103 in the present embodiment, the present invention is not limited thereto. Depending on a desired characteristic, the number of the stages may be increased or decreased.

In addition, although a piezoelectric resonator such as an SAW or an FBAR is used for a resonator in the present embodiment, it is understood that an MEMS resonator causing resonance and antiresonance provides the same effect as an SAW or an FBAR.

In addition, although the passband is a band for digital television broadcast in the present embodiment, the present invention is not limited thereto. For example, the present invention can also be applied to ISDB-T; Integrated Services Digital Broadcasting-Terrestrial, which is a terrestrial digital broadcast in Japan, or DVB-H; Digital Video Broadcasting-Handheld, which is terrestrial digital television broadcast in Europe.

In addition, a band of FOMA (Freedom Of Mobile Multimedia Access) (registered trademark) is an example of an attenuation band, and the present invention is not limited thereto. Transmission frequency bands of mobile telephones of other companies, which are near to a digital television broadcast band, are another example of an attenuation band. Moreover, a PDC (Personal Digital Cellular) and a GSM (Global System for Mobile communication) are still another example of an attenuation band.

In addition, a configuration in which: the matching circuit includes a parallel inductor and a series inductor connected to the notch filter section; and a parallel capacitor is switched, is used in the present embodiment. However, the present invention is not limited thereto. The configuration varies with the characteristic of the notch filter, and only needs to allow reactance devices to be switched.

In addition, although the notch filter section has a π-type three-stage configuration in the present embodiment, the number of the stages and the circuit configuration are not limited thereto. The notch filter section having a T-type configuration or a configuration in which a parallel resonator is connected to a series inductor provides the same effect as the notch filter having a π-type three-stage configuration.

Figure 9:
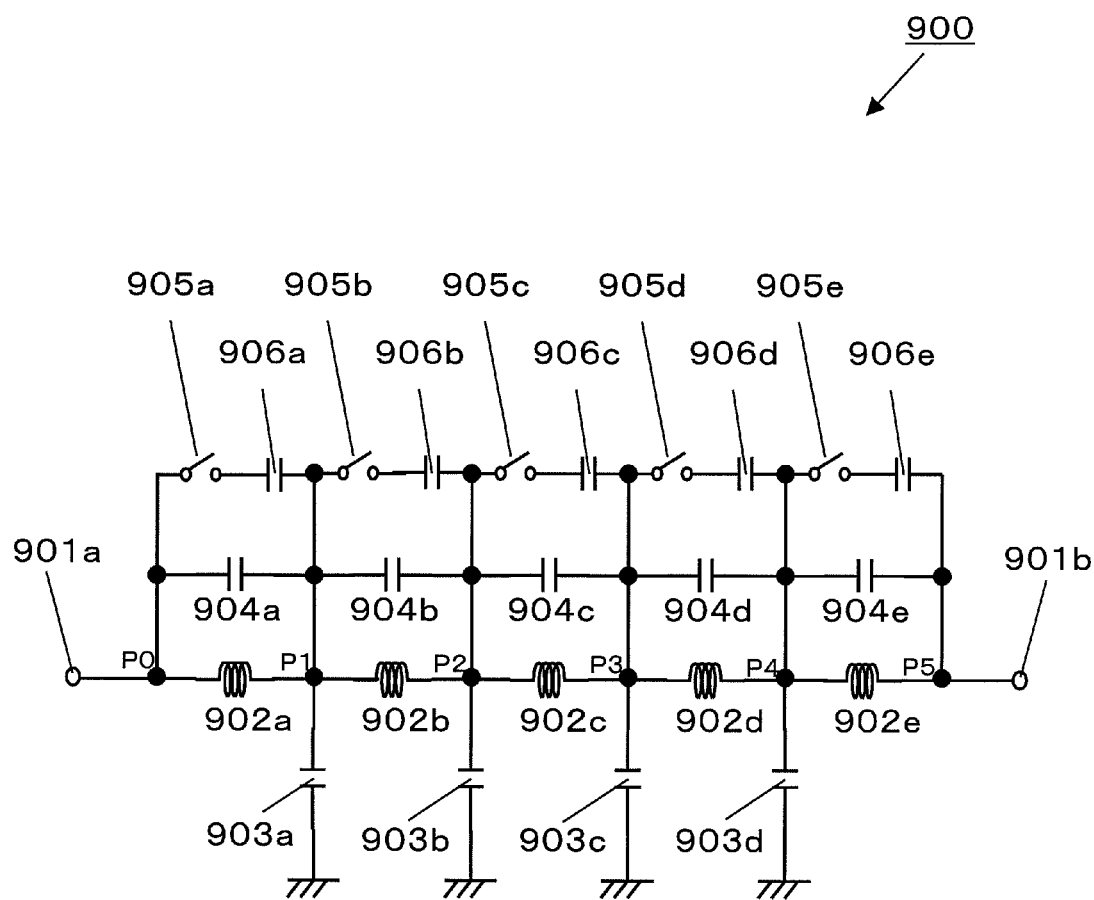
FIG. 9 is an equivalent circuit diagram of a low-pass filter 900 according to the first embodiment of the present invention.

In addition, although the low-pass filter uses series LC resonance to obtain an attenuation pole in the present embodiment, the low-pass filter using parallel LC resonance provides the same effect as the low-pass filter using series LC resonance. FIG. 9 is an equivalent circuit diagram of a low-pass filter 900 using parallel LC resonance. In the low-pass filter 900, a first series inductor 902a, a second series inductor 902b, a third series inductor 902c, a fourth series inductor 902d, and a fifth series inductor 902e are connected in series in this order between an input terminal 901a and an output terminal 901b.

One end of a first parallel capacitor 903a is connected to a connection point P1 between the first series inductor 902a and the second series inductor 902b. One end of a second parallel capacitor 903b is connected to a connection point P2 between the second series inductor 902b and the third series inductor 902c. One end of a third parallel capacitor 903c is connected to a connection point P3 between the third series inductor 902c and the fourth series inductor 902d. One end of a fourth parallel capacitor 903d is connected to a connection point P4 between the fourth series inductor 902d and the fifth series inductor 902e. Note that the other ends of the first parallel capacitor 903a, the second parallel capacitor 903b, the third parallel capacitor 903c, and the fourth parallel capacitor 903d are grounded.

One end of a first series capacitor 904a is connected to a connection point P0 between the input terminal 901a and the first series inductor 902a, and the other end of the first series capacitor 904a is connected to the connection point P1. Moreover, one end of a first additional series capacitor 906a is connected, via a first switch 905a, to the connection point P0, and the other end of the first additional series capacitor 906a is connected to the connection point P1.

Similarly, one end of a second series capacitor 904b is connected to a connection point P1, and the other end of the second series capacitor 904b is connected to the connection point P2. Moreover, one end of a second additional series capacitor 906b is connected, via a second switch 905b, to the connection point P1, and the other end of the second additional series capacitor 906b is connected to the connection point P2. One end of a third series capacitor 904c is connected to a connection point P2, and the other end of the third series capacitor 904c is connected to the connection point P3. Moreover, one end of a third additional series capacitor 906c is connected, via a third switch 905c, to the connection point P2, and the other end of the third additional series capacitor 906c is connected to the connection point P3. One end of a fourth series capacitor 904d is connected to a connection point P3, and the other end of the fourth series capacitor 904d is connected to the connection point P4. Moreover, one end of a fourth additional series capacitor 906d is connected, via a fourth switch 905d, to the connection point P3, and the other end of the fourth additional series capacitor 906d is connected to the connection point P4. One end of a fifth series capacitor 904e is connected to a connection point P4, and the other end of the fifth series capacitor 904e is connected to the connection point P5 between the fifth series inductor 902e and the output terminal 901b. Moreover, one end of a fifth additional series capacitor 906e is connected, via a fifth switch 905e, to the connection point P4, and the other end of the fifth additional series capacitor 906e is connected to the connection point P5.

In the low-pass filter 900, the first to fifth series inductors 902a to 902e are connected in series between the input terminal 901a and the output terminal 901b. Thus, the low-pass filter 900 allows a signal to pass as the frequency of the signal becomes low, as indicated by impedance $j2\pi fL$ (f: frequency, L: inductance value) of an inductor. On the other hand, the first series inductor 902a and the first series capacitor 904a cause parallel LC resonance when the frequency of a signal is high, and form a first attenuation pole at a resonance frequency represented by $1/(2\pi\sqrt{(LC)})$ (L: inductance value, C: capacitor value). Similarly, the second series inductor 902b and the second series capacitor 904b form a second attenuation pole; the third series inductor 902c and the third series capacitor 904c form a third attenuation pole; the fourth series inductor 902d and the fourth series capacitor 904d form a fourth attenuation pole; and the fifth series inductor 902e and the fifth series capacitor 904e form a fifth attenuation pole. Thus, the low-pass filter 900 has a low-pass filter characteristic in which: the low-pass filter 900 allows signals having frequencies in a low-frequency band to pass; and has five attenuation poles in a high-frequency band.

Moreover, by the first to fifth switches 905a to 905e being turned on, each of combined capacitances which are obtained by combining the first to fifth series capacitors 904a to 904e respectively with the first to fifth additional series capacitors 906a to 906e causes series LC resonance, and the respective attenuation poles are shifted by degrees corresponding to the first to fifth additional series capacitors 906a to 906e, toward lower frequency side. As a result, in comparison with the case where the first to fifth switches 905a to 905e are turned off, the attenuation poles approach the stopband which is a mobile telephone transmission frequency band of the mobile telephone terminal.

As described above, the low-pass filter 900 using parallel LC resonance, shown in FIG. 9, realizes a low-pass filter enabling an attenuation pole to be controlled, and provides the same effect as the low-pass filter 103 using series LC resonance, shown in FIG. 3.

(Second Embodiment)

In the first embodiment described above, a wide passband for digital television broadcast is divided into a low-band channel and a high-band channel, and the control section 107 controls the switches of each filter such that the respective pass characteristics corresponding to the low-band channel and the high-band channel have small pass loss. In the present embodiment, a point at which the passband is divided into a low-band channel and a high-band channel will be described in detail.

What is important for determining a boundary dividing a low-band channel and a high-band channel is a desired attenuation point and a desired attenuation amount for each channel. When the integral multiple, particularly, the odd multiple of a local frequency which is the difference between the center frequency and the IF (Intermediate Frequency) of a desired channel which is a desired wave coincides with a frequency band of another system having a high interference level, the frequency band needs to be largely attenuated. In addition, the needed attenuation amount is determined by the level of an interference wave and the performance of a receiving IC, that is, a D/U (Desired/Undesired) ratio.

Currently, a Low-IF method in which an IF filter can be removed is widely adopted as a digital television broadcast receiving method. In the Low-IF method, an IF frequency is set at several hundreds kHz. Upon calculation treating a GHz-band, in which an interference wave is considered, the frequency of a desired wave is near to a local frequency. The following is the calculation on the assumption that the frequency of an interfering wave is approximately equal to a local frequency.

Frequencies three times as large as channel 14 in which the center frequency of a desired wave is 479.14 MHz and frequencies three times as large as channel 15 in which the center frequency of a desired wave is 485.14 MHz coincide with uplink frequencies 1429 to 1453 MHz of PDC 1.5 GHz or CDMA 1.5 GHz. In addition, frequencies three times as large as channel 17 in which the center frequency of a desired wave is 497.14 MHz coincide with downlink frequencies 1477 to 1501 MHz of PDC 1.5 GHz or CDMA 1.5 GHz. That is, frequencies in a frequency band from 1429 to 1501 MHz, which coincide with frequencies three times as large as each of the channels 14, 15, and 17, need to be attenuated.

Moreover, frequencies three times as large as each of channels 30 to 33 coincide with uplink frequencies 1710 to 1785 MHz of GSM 1800 (Band-III), the center frequency of a desired wave in channel 30 being 575.14 MHz, the center frequency of a desired wave in channel 33 being 593.14 MHz. In addition, frequencies three times as large as each of channels 35 to 38 coincide with downlink frequencies 1805 to 1880 MHz of GSM 1800 (Band-III), the center frequency of a desired wave in channel 35 being 605.14 MHz, the center frequency of a desired wave in channel 38 being 623.14 MHz. In addition, frequencies three times as large as channel 40 in which the center frequency of a desired wave is 635.14 MHz coincide with frequencies 1893 to 1919 MHz of domestic PHS. In addition, frequencies three times as large as each of channels 41 to 44 coincide with uplink frequencies 1920 to 1980 MHz of UMTS 2.0 GHz (Band-I), the center frequency of a desired wave in channel 41 being 641.14 MHz, the center frequency of a desired wave in channel 44 being 659.14 MHz. That is, frequencies in a frequency band from 1710 to 1980 MHz, which coincide with frequencies three times as large as each of the channels 33 to 41, need to be largely attenuated.

Figure 10:
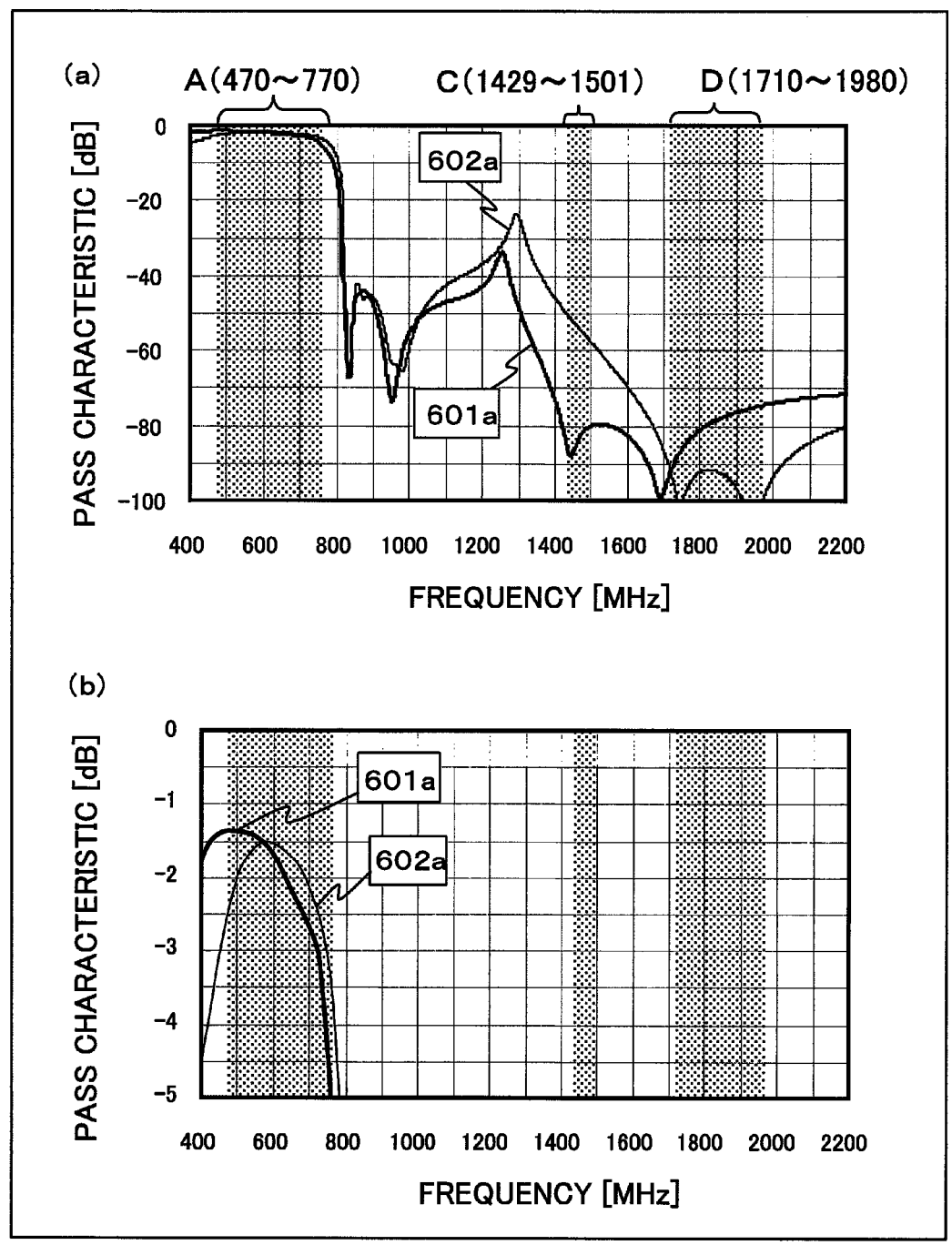
FIG. 10 is a diagram showing the pass characteristic of the high-frequency filter 106 according to the first embodiment of the present invention.

FIG. 10 is a diagram showing, over further wide range of frequencies, the pass characteristic of the high-frequency filter 106 according to the first embodiment, which is shown in FIG. 6. Channels 14, 15, and 17 are included in the low-band channel. Therefore, the control section 107 turns on the switch 208 of the notch filter 102, and the first to fifth switches 305a to 305e of the low-pass filter 103, and thereby the pass characteristic of the high-frequency filter 106 becomes the pass characteristic 601a. In this case, frequencies in a frequency band C, 1429 to 1501 MHz, which coincide with frequencies three times as large as each of the channels 14, 15, and 17, are attenuated owing to an attenuation pole of the characteristic of the low-pass filter 103. Channels 33 to 41 are included in the high-band channel. Therefore, the control section 107 turns off the switch 208 of the notch filter 102, and the first to fifth switches 305a to 305e of the low-pass filter 103, and thereby the pass characteristic of the high-frequency filter 106 becomes the pass characteristic 602a. In this case, frequencies in a frequency band D, 1710 to 1980 MHz, which coincide with frequencies three times as large as each of the channels 33 to 41, are attenuated owing to an attenuation pole of the characteristic of the low-pass filter 103.

Thus, by designing attenuation poles such that desired frequencies in each of the low-band channel and the high-band channel are attenuated by turning on or off the first to fifth switches 305a to 305e of the low-pass filter 103, a low-pass filter having a decreased stages of series LC resonators can be realized.

Therefore, it is desirable that a point at which the passband is divided into the low-band channel and the high-band channel is between channels 29 and 30, or between channels lower than them.

Note that it is understood that, upon determination of the point, it is important to compare pass loss between the pass characteristic 401 and the pass characteristic 402 of the notch filter 102, which are switched by the switch 208, and to compare pass loss between the pass characteristic 501 and the pass characteristic 502 of the low-pass filter 103, which are switched by the first to fifth switches 305a to 305e.

Industrial Applicability

A high-frequency filter of the present invention can realize a characteristic in which loss is small. The high-frequency filter is useful as, for example, a filter in a radio circuit of a digital television receiving tuner or the like included in a mobile telephone or a mobile terminal. In addition, the high-frequency filter can be applied to a filter for a radio base station, or the like, in accordance with the specification.

The invention claimed is:

1. A high-frequency filter whose passband is a predetermined frequency band for digital television broadcast, and whose stopband is a mobile telephone terminal transmission band which is near to the passband, the high-frequency filter comprising:
   a notch filter including: a first characteristic having predetermined pass loss in the passband, and having a predetermined attenuation amount in the stopband; and a second characteristic having a passband which is included in the predetermined frequency band and is narrower than the predetermined frequency band, and having, in the stopband, an attenuation amount larger than the predetermined attenuation amount;
   a low-pass filter including: a first characteristic which has an attenuation pole set to be near to the stopband, and thereby has an attenuation amount larger than the predetermined attenuation amount; and a second characteristic which has an attenuation pole set to be distant from the stopband, and thereby has, in the passband which is the predetermined frequency band, pass loss smaller than the predetermined pass loss; and
   a control section which, if a channel selected by a user is a low-band channel that is within the passband and on a lower-frequency side of a threshold frequency in the passband, operates the notch filter and the low-pass filter by combining the first characteristic of the notch filter and the first characteristic of the low-pass filter, and if the channel selected by the user is a high-band channel that is within the passband and on a higher-frequency side of the threshold frequency, operates the notch filter and the low-pass filter by combining the second characteristic of the notch filter and the second characteristic of the low-pass filter.

2. The high-frequency filter according to claim 1, wherein the high-band channel is equal to or higher than a channel, a frequency three times as large as a local frequency of the channel being coincide with a frequency in a frequency band of 1710 to 1785 MHz used in a mobile telephone system.

3. The high-frequency filter according to claim 1, wherein the low-band channel is equal to or lower than a channel, a frequency three times as large as a local frequency of the channel being coincide with a frequency in a frequency band of 1477 to 1501 MHz used in a mobile telephone system.

4. The high-frequency filter according to claim 1, wherein an intermediate frequency is sufficiently low for a local frequency of the selected channel to be substantially equal to a frequency of a desired wave.

5. The high-frequency filter according to claim 1, wherein
   the high-band channel is equal to or higher than a channel, a frequency three times as large as a local frequency of the channel being coincide with a frequency in a frequency band of 1710 to 1785 MHz used in a mobile telephone system,
   the low-band channel is equal to or lower than a channel, a frequency three times as large as a local frequency of the channel being coincide with a frequency in a frequency band of 1477 to 1501 MHz used in a mobile telephone system, and
   an intermediate frequency is sufficiently low for a local frequency of the selected channel to be substantially equal to a frequency of a desired wave.

6. The high-frequency filter according to claim 1, wherein frequency bands including frequencies equal to integral multiples of frequencies of respective desired waves of the low-band channel and the high-band channel are attenuated.

7. The high-frequency filter according to claim 1, wherein the notch filter
   includes
      a plurality of piezo resonators including at least one series piezo resonator, and
      a reactance device connected in parallel to the at least one series piezo resonator, and
   obtains the first characteristic and the second characteristic by changing a reactance value of the reactance device.

8. The high-frequency filter according to claim 7, wherein the reactance device value is changed by a switch being switched to a connected state or an unconnected state.

9. The high-frequency filter according to claim 7, wherein the reactance device is formed by a capacitor.

10. The high-frequency filter according to claim 1, wherein the low-pass filter
    includes a plurality of inductors and a plurality of capacitors which cause LC resonance, and
    obtains the first characteristic and the second characteristic by changing capacitance values of the plurality of capacitors.

11. A communication apparatus comprising:

an antenna transmitting and receiving a high-frequency signal;

a filter attenuating, among received signals, a signal having a frequency other than a channel frequency;

a low noise amplifier amplifying a faint signal obtained by the filter; and a digital television receiving circuit section demodulating a received signal amplified by the low noise amplifier, wherein the high-frequency filter according to claim 1 is applied to the filter.

* * * * *